United States Patent
Nakatsuka et al.

(10) Patent No.: US 7,531,943 B2
(45) Date of Patent: May 12, 2009

(54) ACOUSTIC RESONATOR AND FILTER

(75) Inventors: Hiroshi Nakatsuka, Katano (JP); Keiji Onishi, Settsu (JP); Hiroyuki Nakamura, Katano (JP); Tomohiro Iwasaki, Toyonaka (JP)

(73) Assignee: Panasonic Corporation, Osaka (JP)

( * ) Notice: Subject to any disclaimer, the term of this patent is extended or adjusted under 35 U.S.C. 154(b) by 596 days.

(21) Appl. No.: 11/092,722

(22) Filed: Mar. 30, 2005

(65) Prior Publication Data

US 2005/0218753 A1    Oct. 6, 2005

(30) Foreign Application Priority Data

Mar. 31, 2004    (JP)    ............... 2004-106209

(51) Int. Cl.
    *H01L 41/08*    (2006.01)
(52) U.S. Cl. .................................. 310/324
(58) Field of Classification Search ................ 310/320,
    310/322, 324, 346, 335, 339, 311, 348, 363,
    310/364, 365, 366; 333/187, 189, 186, 191,
    333/193, 195, 133; *H03H 9/00; H01L 41/08*
    See application file for complete search history.

(56) References Cited

U.S. PATENT DOCUMENTS

| | | | | |
|---|---|---|---|---|
| 6,992,460 B1 * | 1/2006 | Arikara et al. | ............... | 320/101 |
| 7,019,604 B2 * | 3/2006 | Gotoh et al. | ................. | 333/187 |
| 7,385,464 B2 * | 6/2008 | Shibagaki et al. | ............ | 333/195 |
| 7,408,429 B2 * | 8/2008 | Iwasaki et al. | ............... | 333/191 |
| 7,414,495 B2 * | 8/2008 | Iwasaki et al. | ............... | 333/133 |

FOREIGN PATENT DOCUMENTS

| | | |
|---|---|---|
| JP | 60-68711 | 4/1985 |
| JP | 9-064675 | 3/1997 |
| JP | 2003-87085 | 3/2003 |

\* cited by examiner

*Primary Examiner*—Quyen P Leung
*Assistant Examiner*—Karen B Addison
(74) *Attorney, Agent, or Firm*—Wenderoth, Lind & Ponack, L.L.P.

(57) ABSTRACT

The area of an opening C of a cavity is equal to or greater than the area of a horizontal cross section D of a vibrating section. The vibrating section is placed on a support section at a position such that a vertical projection of the vibrating section onto a substrate is accommodated within the opening C of the cavity. Moreover, the sum of a vertical thickness t1 of the vibrating section and a vertical thickness t2 of the support section is equal to one wavelength of a resonance frequency fr of an acoustic resonator (one wavelength=t1+t2), while the thickness t1 of the vibrating section and the thickness t2 of the support section are different from each other (t1≠t2). Thus, neither the thickness t1 of the vibrating section nor the thickness t2 of the support section is equal to the half wavelength of the resonance frequency fr.

15 Claims, 19 Drawing Sheets

| (HALF WAVELENGTH—<br>THICKNESS OF SUPPORT SECTION) /WAVELENGTH | RESULT |
|---|---|
| −35% | × |
| −30% | ○ |
| −20% | ◎ |
| −10% | ◎ |
| 0 | − |
| 5% | ◎ |
| 10% | ○ |
| 20% | ○ |
| 25% | × |

| (HALF WAVELENGTH−<br>THICKNESS OF SUPPORT SECTION) /WAVELENGTH | RESULT |
|---|---|
| −50% | × |
| −40% | ○ |
| −30% | ◎ |
| −20% | ◎ |
| 0 | − |
| 20% | ◎ |
| 30% | ○ |
| 40% | ○ |
| 50% | × |

ACOUSTIC RESONATOR AND FILTER

BACKGROUND OF THE INVENTION

1. Field of the Invention

The present invention relates to an acoustic resonator and a filter, and more particularly to an acoustic resonator capable of suppressing the occurrence of spurious components, and a filter using the same.

2. Description of the Background Art

There is a demand for reducing the size and weight of components to be used in electronic devices such as portable devices. For example, a filter used in a portable device is required to be small in size and to allow for precise adjustment of the frequency characteristics thereof. A filter known in the art that satisfies such a requirement is a filter using an acoustic resonator as disclosed in Japanese Laid-Open Patent Publication No. 60-68711 (Patent Document 1).

A conventional acoustic resonator will now be described with reference to FIG. 17A to FIG. 17D.

FIG. 17A is a cross-sectional view showing the basic structure of a conventional acoustic resonator 500. The acoustic resonator 500 includes a piezoelectric element 501 interposed between an upper electrode 502 and a lower electrode 503. The acoustic resonator 500 is used while being placed on a substrate 505 with a cavity 504 formed therein. The cavity 504 can be formed by partially etching the substrate 505 from the bottom surface thereof using a micromachining method. The upper electrode 502 and the lower electrode 503 apply an electric field across the acoustic resonator 500 in the thickness direction, thereby causing the acoustic resonator 500 to vibrate in the thickness direction. Next, the operation of the acoustic resonator 500 will be described with respect to the thickness longitudinal vibration of an infinite flat plate.

FIG. 17B is a schematic perspective view illustrating the operation of the conventional acoustic resonator 500. When an electric field is applied across the acoustic resonator 500 between the upper electrode 502 and the lower electrode 503, an electric energy is converted to a mechanical energy by the piezoelectric element 501. The induced mechanical vibration is a thickness extensional vibration, and causes the piezoelectric element 501 to expand and contract in the same direction as the electric field. Typically, the acoustic resonator 500 utilizes the resonant vibration in the thickness direction of the piezoelectric element 501 to resonate at a frequency such that the thickness thereof is equal to the half wavelength. The cavity 504 shown in FIG. 17A is used for accommodating the thickness longitudinal vibration of the piezoelectric element 501.

As shown in FIG. 17D, the equivalent circuit of the acoustic resonator 500 has both a series resonance portion and a parallel resonance portion. The equivalent circuit includes a series resonance section made up of a capacitor C1, an inductor L1 and a resistor R1, and a capacitor C0 connected in parallel to the series resonance section. With such a circuit configuration, the equivalent circuit has admittance-frequency characteristics with a maximum admittance at the resonance frequency fr and a minimum admittance at the antiresonance frequency fa, as shown in FIG. 17C. The resonance frequency fr and the antiresonance frequency fa satisfy the following relationship.

$$fr = 1/(2\pi\sqrt{L1 \times C1})$$

$$fa = fr\sqrt{1 + C1/C0}$$

If the acoustic resonator 500 having such admittance-frequency characteristics is used as a filter, it is possible to realize a filter having a small size and a small loss because of the utilization of the resonant vibration of the piezoelectric element 501.

Another conventional acoustic resonator as disclosed in Japanese Laid-Open Patent Publication No. 2003-87085 (Patent Document 2), for example, aims at reducing the energy loss at the electrode while improving the resonance frequency stability against temperature changes. FIG. 18 is a cross-sectional view showing the basic structure of a conventional acoustic resonator 510 disclosed in Patent Document 2. The conventional acoustic resonator 510 includes a substrate 515 with a cavity 514 formed therein, and a support layer 513 formed on the substrate 515. A lower electrode 513 is formed on a support layer 516. A piezoelectric element 511 is formed on the lower electrode 513. An upper electrode 512 is formed on the piezoelectric element 511.

The conventional acoustic resonator 510 is designed so that the thickness of the support layer 516 is equal to the thickness of a vibrating section including the piezoelectric element 511, the upper electrode 512 and the lower electrode 513, i.e., so that the interface between the lower electrode 513 and the support layer 516 coincides with an antinode of displacement distribution caused by an $n^{th}$ harmonic wave. With such a configuration, the conventional acoustic resonator 510 aims at reducing the vibration loss at the electrode section.

Since only a portion of an acoustic resonator is actually fixed to a substrate, not the whole of the acoustic resonator will freely vibrate in the thickness longitudinal mode. Referring to FIG. 17A, a vibrating section is divided into a first region around the cavity that vibrates while being fixed, and a second region within the opening of the cavity that vibrates with opposite ends thereof being free ends. In the vibrating section, a vibration that is dictated by the thickness of the vibrating section is caused as the primary resonant vibration. However, the vibration at a frequency f1 caused in the vibrating section may leak to the substrate in the fixed region around the cavity. This phenomenon occurs because the portion around the cavity to which the vibrating section is fixed is not actually serving as a completely fixed end. Therefore, the transverse mode vibration occurring in the vibrating section propagates to the substrate via the fixed portion, thus causing the vibration leak. As a result, the leaking vibration induces other vibrations, whereby a spurious vibration occurs near the primary resonant vibration (f1), in addition to the intended thickness extensional vibration of the fundamental mode (½ wavelength mode, the frequency f1). This means that a portion of the energy to be used for causing a vibration inside the piezoelectric element is lost by the vibration leak.

Such a spurious vibration is caused due to the vibration leak to the substrate via the fixed portion. For example, where the resonance frequency of the vibration mode dictated by the cavity depth is present near the primary resonance frequency, a vibration dictated by the cavity depth occurs as a spurious vibration near the resonance frequency of the vibrating section due to the vibration leak. If the frequency of the spurious vibration, is between the resonance frequency fr and the antiresonance frequency fa, a spurious component appears as shown in FIG. 19A. If acoustic resonators having such a spurious vibration are connected in parallel as shown in FIG. 19B to form a filter, undesirable bandpass characteristics appear in the passband portion as shown in FIG. 19C. The bandpass characteristics lower the communication quality.

However, the conventional acoustic resonators disclosed in Patent Document 1 and Patent Document 2 fail to take into consideration the spurious vibration occurring due to the vibration leak from the support section to the substrate, i.e., the spurious vibration dictated by the cavity depth. With these conventional techniques, it is not possible to realize an acoustic resonator having admittance-frequency characteristics with no spurious components.

SUMMARY OF THE INVENTION

Therefore, an object of the present invention is to provide an acoustic resonator and a filter capable of preventing the occurrence of a spurious vibration due to a vibration leak.

The present invention is directed to an acoustic resonator vibrating at a predetermined frequency. In order to achieve the object set forth above, the acoustic resonator of the present invention in its basic form includes a vibrating section, a substrate section and a support section having the following features. The vibrating section includes a piezoelectric element, an upper electrode provided on an upper surface of the piezoelectric element, and a lower electrode provided on a lower surface of the piezoelectric element. The substrate section has a cavity formed therein, the cavity having an opening whose area is equal to or greater than a horizontal cross section of the vibrating section. The support section is provided between the vibrating section and the substrate section. The vibrating section is placed on the support section at a position such that a vertical projection of the vibrating section onto the substrate section is accommodated within the opening of the cavity.

The structure is characteristic in that the vibrating section and the support section are shaped so that vertical thicknesses thereof are different from each other with a sum of the vertical thicknesses being equal to one wavelength of a vibration frequency (i.e., resonant vibration frequency) and so that an interface between the piezoelectric element and the lower electrode does not coincide with an antinode of vibration. With this structure, it is preferred that a proportion of the thickness of the support section with respect to a half wavelength of the vibration frequency is in a range of −30% to +20%.

The acoustic resonator of the present invention in one applied form includes a vibrating section, a substrate section and a support section having the following features. The vibrating section includes a first piezoelectric element, an upper electrode provided on an upper surface of the first piezoelectric element, and a first lower electrode provided on a lower surface of the first piezoelectric element. The substrate section has a cavity formed therein, the cavity having an opening whose area is equal to or greater than a horizontal cross section of the vibrating section. The support section includes a second piezoelectric element, a second lower electrode provided on a lower surface of the second piezoelectric element, and a support layer provided on a lower surface of the second lower electrode, and the support section is provided between the vibrating section and the substrate section. The vibrating section is placed on the support section at a position such that a vertical projection of the vibrating section onto the substrate section is accommodated within the opening of the cavity.

The structure is characteristic in that the vibrating section and the support section are shaped so that vertical thicknesses thereof are different from each other with a sum of the vertical thicknesses being equal to one wavelength of a vibration frequency (i.e., resonant vibration frequency) and so that an interface between the first piezoelectric element and the first lower electrode does not coincide with an antinode of vibration. With this structure, it is preferred that a proportion of the thickness of the support section with respect to a half wavelength of the vibration frequency is in a range of −40% to +40%.

Preferably, the second piezoelectric element and the second lower electrode are shaped so that a horizontal cross section thereof is less than or equal to the area of the opening of the cavity and so that a vertical projection thereof onto the substrate section is accommodated within the opening of the cavity.

The upper electrode of the vibrating section may be extended over an upper surface of the (first) piezoelectric element via an insulative layer. In such a case, it is preferred that thicknesses of the vibrating section and the support section are determined so that neither an upper surface of the insulative layer provided on the support section nor an upper surface of an interconnect of the upper electrode routed over the support section via the insulative layer coincides with the antinode of vibration.

While any of the acoustic resonators of the present invention as set forth above can independently function as a filter, two or more acoustic resonators of the present invention may be connected together in a ladder-shaped arrangement to realize filters of various frequency characteristics. A duplexer can be obtained by using such filters as a transmission filter and a reception filter and adding a phase-shift circuit. Such a duplexer can be used in a communications device together with, for example, a splitter for splitting a signal. The filters may also be used in a communications device together with, for example, a switch for passing an input signal selectively to different paths.

As described above, in an acoustic resonator of the present invention, the vibrating section and the support section, which as a whole vibrates in a one-wavelength mode, are formed with different thicknesses. Moreover, the relationship between the vibrating section and the cavity in terms of the size and position is appropriately adjusted. Thus, the vibrating section and the support section can be designed to have different resonance frequencies, whereby it is possible to reduce the propagation of a vibration in the horizontal direction. Therefore, it is possible to obtain admittance-frequency characteristics without a spurious component between the resonance frequency and the antiresonance frequency of the vibrating section. Also where an insulative layer is formed, the vibrating section and the support section can be designed to have different resonance frequencies, whereby it is possible to reduce the propagation of a vibration in the horizontal direction. Where a vibrating section including a piezoelectric element and a lower electrode is formed also in the support section, the vibration leaking to the support section can be effectively converted from an electric energy to a mechanical energy.

These and other objects, features, aspects and advantages of the present invention will become more apparent from the following detailed description of the present invention when taken in conjunction with the accompanying drawings.

DESCRIPTION OF THE PREFERRED EMBODIMENTS (First Acoustic Resonator)

Figure 1:
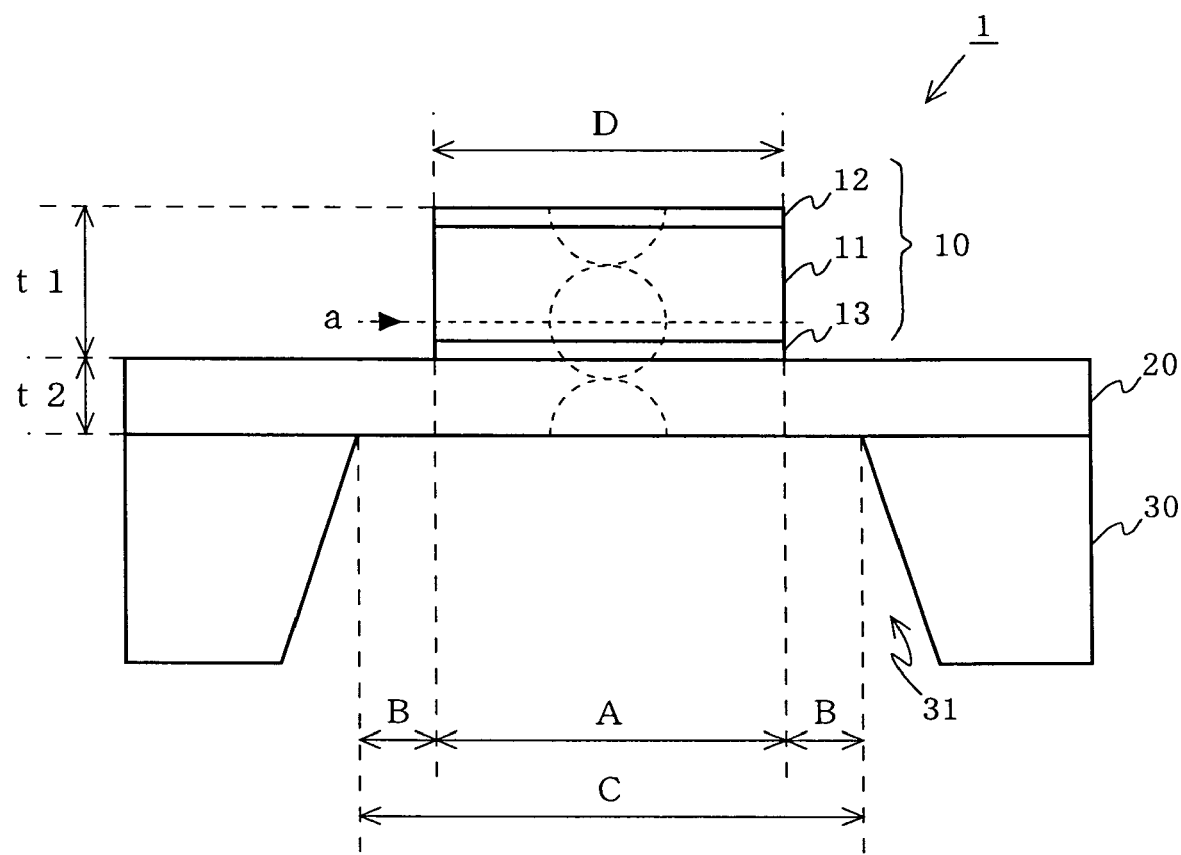
FIG. 1 is a cross-sectional view showing the structure of a first acoustic resonator of the present invention.

FIG. 1 is a cross-sectional view showing the structure of a first acoustic resonator 1 of the present invention. Referring to FIG. 1, the acoustic resonator 1 includes a substrate 30, a support section 20 formed on the substrate 30, and a vibrating section 10 formed on the support section 20. The substrate 30 has a cavity 31 for accommodating the longitudinal vibration of the vibrating section 10. The support section 20 is a support layer for supporting the vibrating section 10 on the substrate 30. The vibrating section 10 includes a piezoelectric element 11 using a piezoelectric material such as aluminum nitride (AlN), an upper electrode 12 formed on the upper surface of the piezoelectric element 11, and a lower electrode 13 formed on the lower surface of the piezoelectric element 11. The material of the upper electrode 12 and the lower electrode 13 may be, for example, molybdenum. The vibrating section 10 is placed on the support section 20 with the lower electrode 13 facing down.

The acoustic resonator 1 as described above is designed so as to be vibrated in a one-wavelength mode and is designed with a characteristic structure to be described below.

The cavity 31 formed in the substrate 30 and the vibrating section 10 are in the following relationship with each other. The area of an opening C of the cavity 31 is equal to or greater than the area of a horizontal cross section D of the vibrating section 10. The vibrating section 10 is placed on the support section 20 at a position such that the vertical projection of the vibrating section 10 onto the substrate 30 is accommodated within the opening C of the cavity 31. The shape of the cavity 31 is not limited to any particular shape as long as the cavity 31 can accommodate the thickness longitudinal vibration while satisfying the above relationship. FIG. 1 shows an example where the cavity 31 formed in the substrate 30 has a trapezoidal cross section.

The vibrating section 10 and the support section 20 are in the following relationship with each other. The sum of a vertical thickness t1 of the vibrating section 10 and a vertical thickness t2 of the support section 20 is equal to one wavelength of the resonance frequency (resonant vibration frequency) fr of the acoustic resonator 1 (one wavelength=t1+t2). The thickness t1 of the vibrating section 10 and the thickness t2 of the support section 20 are different from each other (t1≠t2). This means that neither the thickness t1 of the vibrating section 10 nor the thickness t2 of the support section 20 is equal to the half wavelength of the resonance frequency fr (the position "a" shown in FIG. 1) (half wavelength≠t1, t2). In other words, the thicknesses are determined so that a resonance frequency frs (=vs/(2×t1)) of the vibrating section 10 and a resonance frequency frc (=vc/(2×t2)) of the support section 20 satisfy frs≠frc. Herein, vs is the average sound velocity in the vibrating section 10, and vc is the sound velocity in the support section 20.

Next, advantageous effects obtained from this structure will be described.

As described above in the Background Art section, a spurious vibration occurs due to a vibration leaking to the substrate section via a member for fixing the vibrating section to the substrate section. With the acoustic resonator 1 of the present invention, as with the conventional examples, in a region A where the vibrating section 10 and the support section 20 are present, a vibration caused in the vibrating section 10 leaks to the support section 20 so that the overall vibration is a vibration of one wavelength of the resonance frequency fr. However, with the structure where neither the thickness t1 of the vibrating section 10 nor the thickness t2 of the support section 20 is equal to the half wavelength of the resonance frequency fr, the resonance frequency of a region B where only the support section 20 is present is different from that of the region A. Moreover, the vibrating section 10 and the cavity 31 are in a special relationship with each other in terms of the size and position. As a result, the induction of the vibration traveling in the horizontal direction (perpendicular to the vertical direction) is suppressed in the region A, and the vibration will not be propagated to the region B but is substantially confined within the region A, whereby it is possible to prevent the occurrence of a spurious vibration near the resonance frequency fr.

Figure 2A:
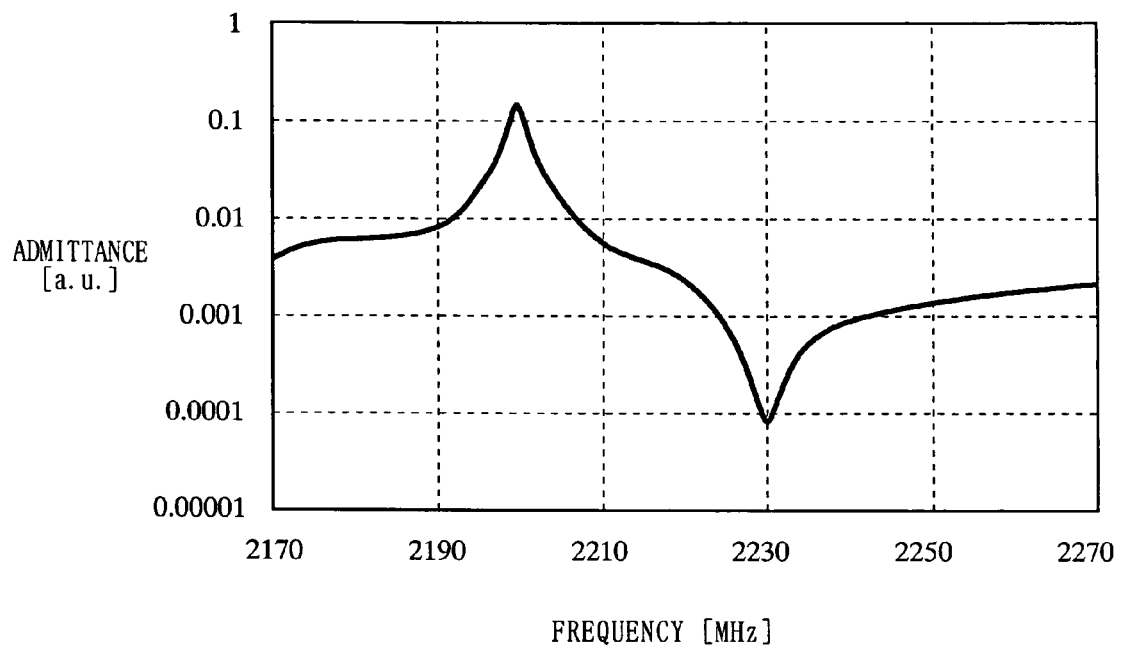
FIG. 2A shows admittance-frequency characteristics of the first acoustic resonator of the present invention.
Figure 2B:
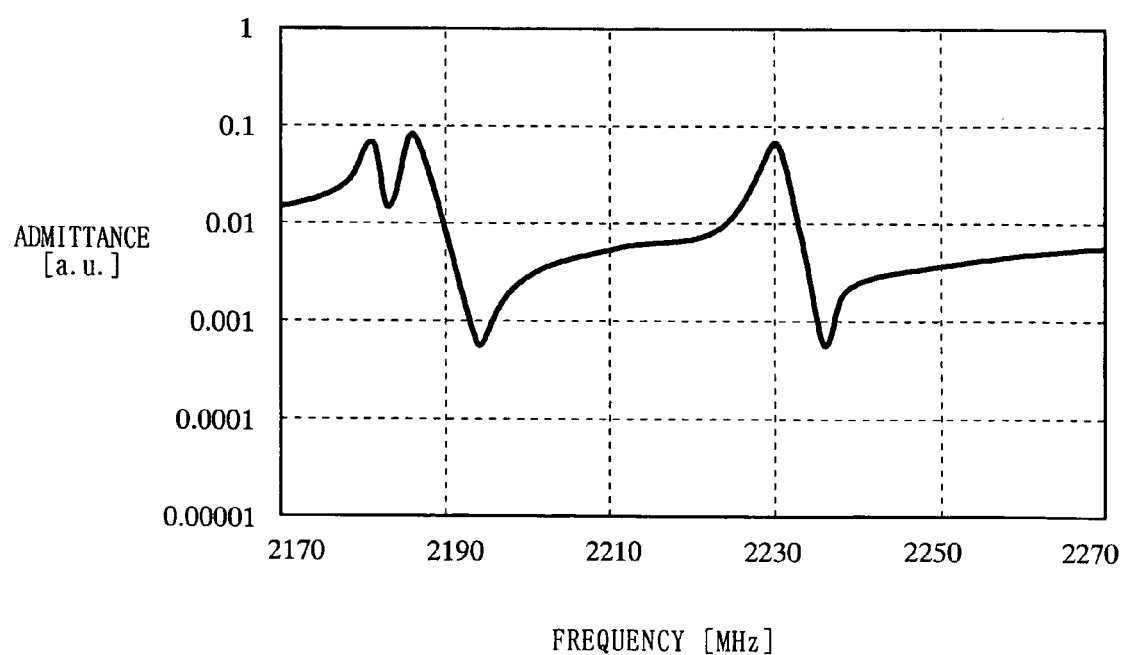
FIG. 2B shows admittance-frequency characteristics of a conventional acoustic resonator shown in FIG. 17C.
Figure 17A:
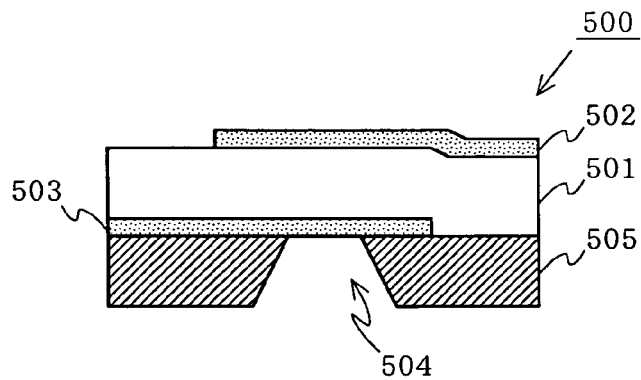
FIG. 17A to FIG. 17D are used for illustrating a conventional acoustic resonator.
Figure 17B:
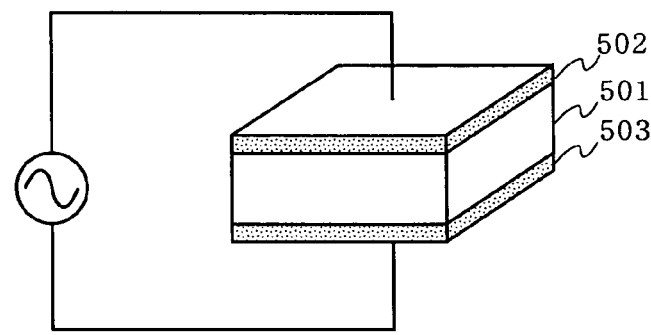
Figure 17C:
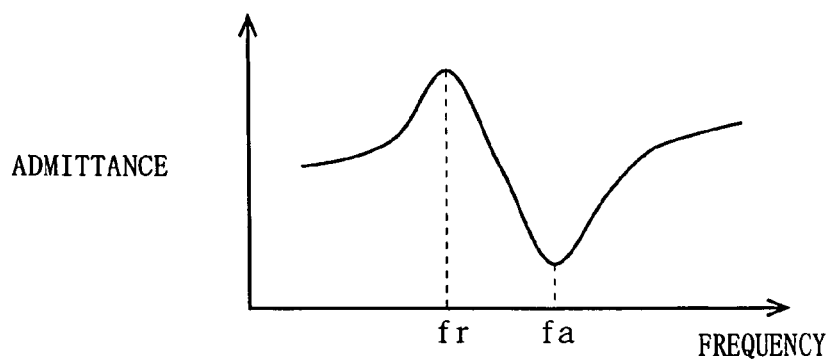
Figure 17D:
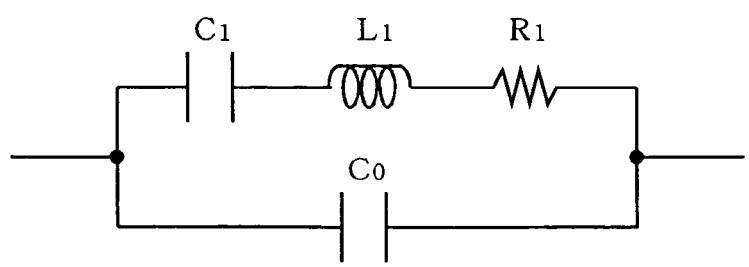
Figure 18:
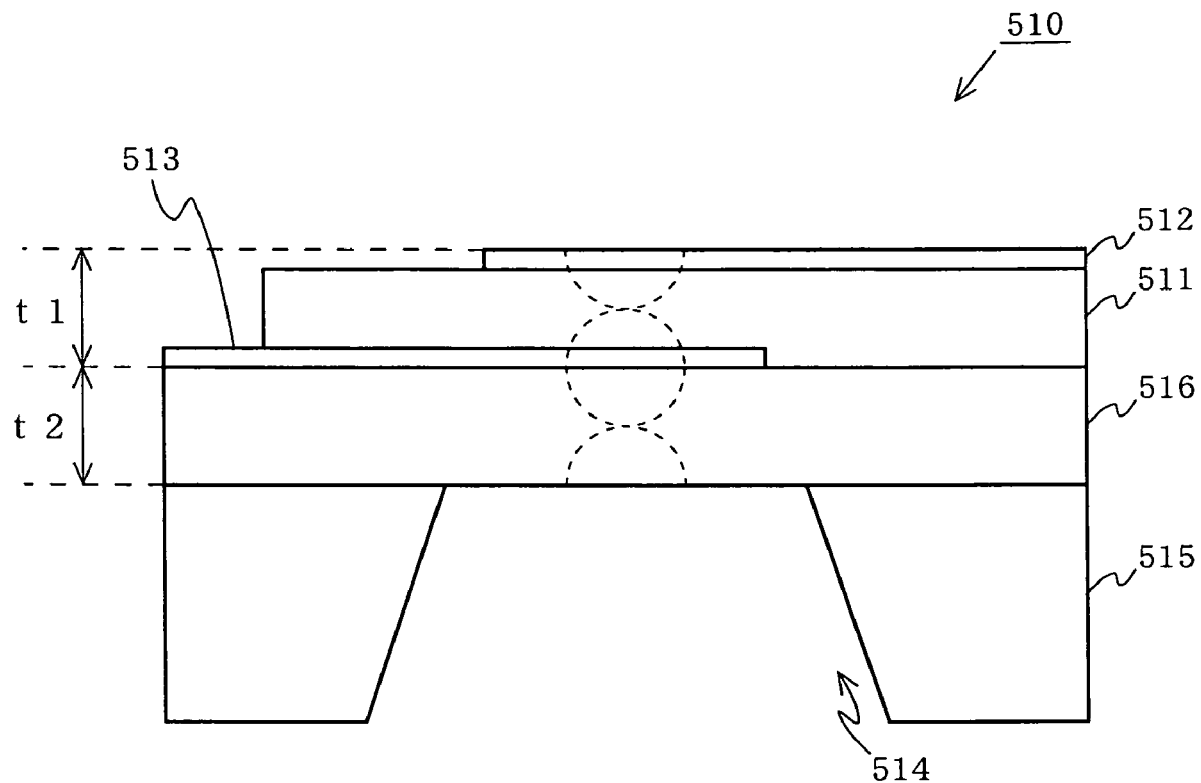
FIG. 18 shows another conventional acoustic resonator.
Figure 19A:
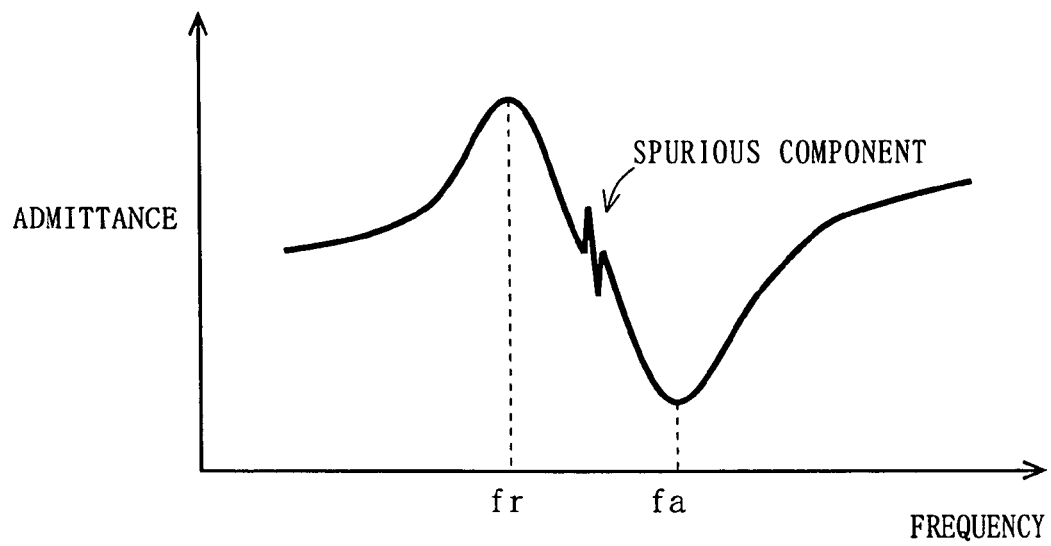
FIG. 19A to FIG. 19C are used for illustrating problems associated with conventional acoustic resonators.
Figure 19B:
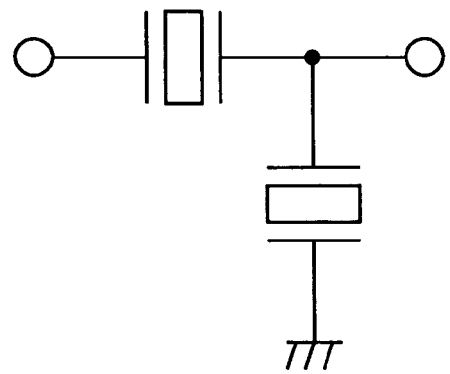
Figure 19C:
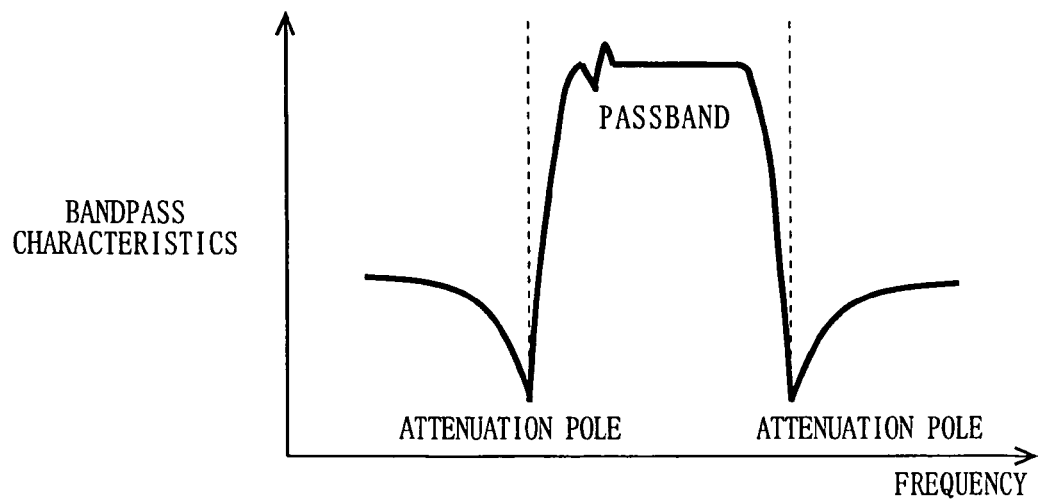

FIG. 2A and FIG. 2B show simulated admittance-frequency characteristics of the acoustic resonator 1 of the present invention and the conventional acoustic resonator shown in FIG. 17C, respectively. As shown in FIG. 2A, the acoustic resonator 1 gives an admittance curve with no spurious component between the resonance frequency and the antiresonance frequency. Therefore, if a filter is provided using the acoustic resonator 1, the filter will have a smooth bandpass characteristics curve. As shown in FIG. 2B, the conventional acoustic resonator of FIG. 2B suffers from a spurious component, failing to give an intended admittance curve.

Figure 3A:
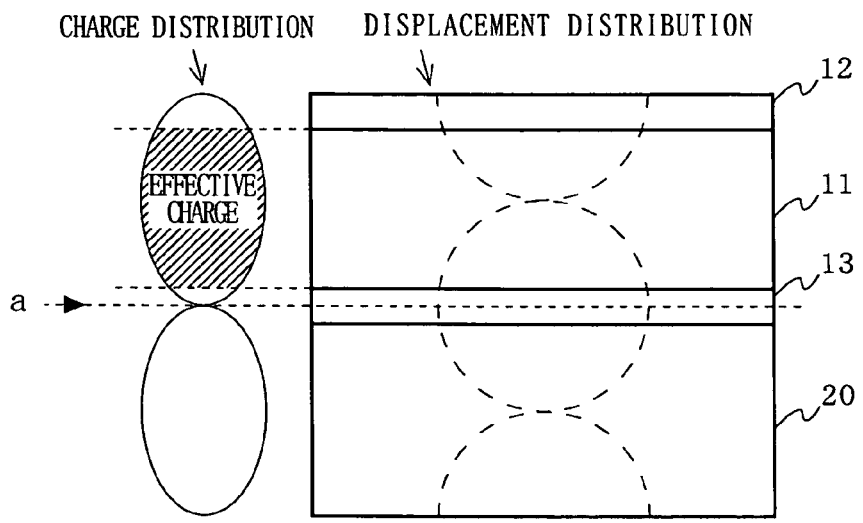
FIG. 3A to FIG. 3C show the displacement distribution and the charge distribution of the first acoustic resonator of the present invention.
Figure 3B:
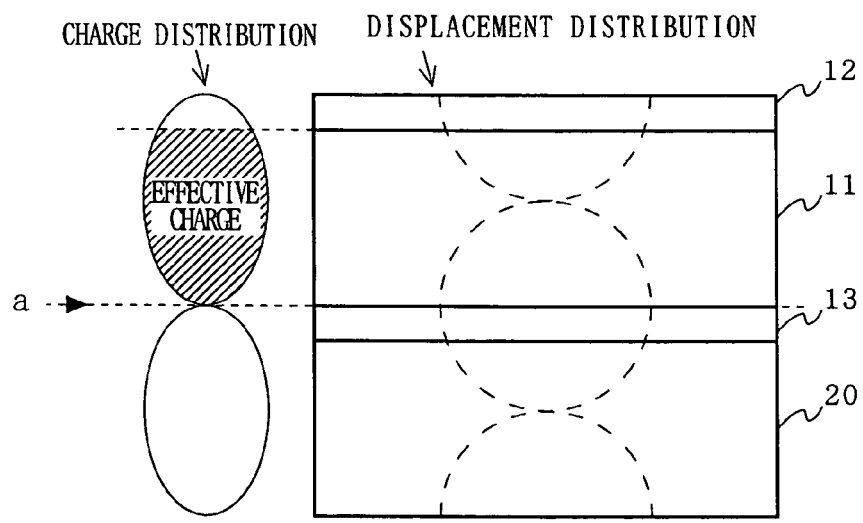
Figure 3C:
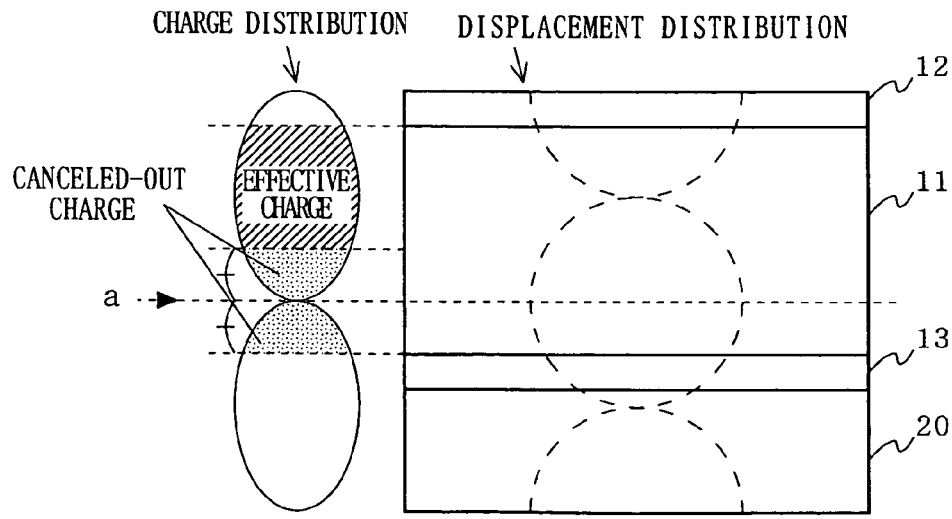

The thickness t1 of the vibrating section 10 and the thickness t2 of the support section 20 may be optimized as follows. FIG. 3A to FIG. 3C show the displacement distribution and the charge distribution of the acoustic resonator 1. FIG. 3A shows an example of the acoustic resonator 1 where the position "a" of the half wavelength of the resonance frequency (i.e., the antinode of displacement distribution at which the vibration gives the maximum displacement) is located within the lower electrode 13. FIG. 3B shows another example of the acoustic resonator 1 where the position "a" of the half wavelength of the resonance frequency is located at the upper surface of the lower electrode 13 (at or near the interface between the piezoelectric element 11 and the lower electrode 13). FIG. 3C shows still another example of the acoustic resonator 1 where the position "a" of the half wavelength of the resonance frequency is located within the piezoelectric element 11. As is well known in the art, in the vibrating section 10, only the charge existing in the piezoelectric element 11 is converted to a vibration. Thus, in the acoustic resonator 1 of FIG. 3A, the charge in the lower electrode 13 is not an effective charge. In the acoustic resonator 1 of FIG. 3C, although the total amount of charge existing in the piezoelectric element 11 increases, the amount of effective charge will decrease as charges of opposite polarities will cancel out each other. Therefore, the acoustic resonator 1 shown in FIG. 3B is the most preferred, high-Q-value, and wide-band acoustic resonator capable of reducing the energy loss due to the vibration leak while effectively converting the charge to a vibration.

In an actual product, however, an interconnect pattern connected to the lower electrode 13 is formed with the same thickness as that of the lower electrode 13. Therefore, a portion of the region B where the interconnect pattern is formed will have a thickness equal to the total thickness of the support section 20 and the lower electrode 13. Thus, if the position "a" of the half wavelength of the resonance frequency is located at the upper surface of the lower electrode 13 as shown in FIG. 3B, the resonance frequency of a portion of the region B where the interconnect pattern is formed will coincide with that of the region A, resulting in a vibration leak from the region A to the region B. Therefore, it is preferred in practice that the position "a" of the half wavelength of the resonance frequency is set within a range to be described below excluding the position at the upper surface of the lower electrode 13.

Figures 4A, 4B:
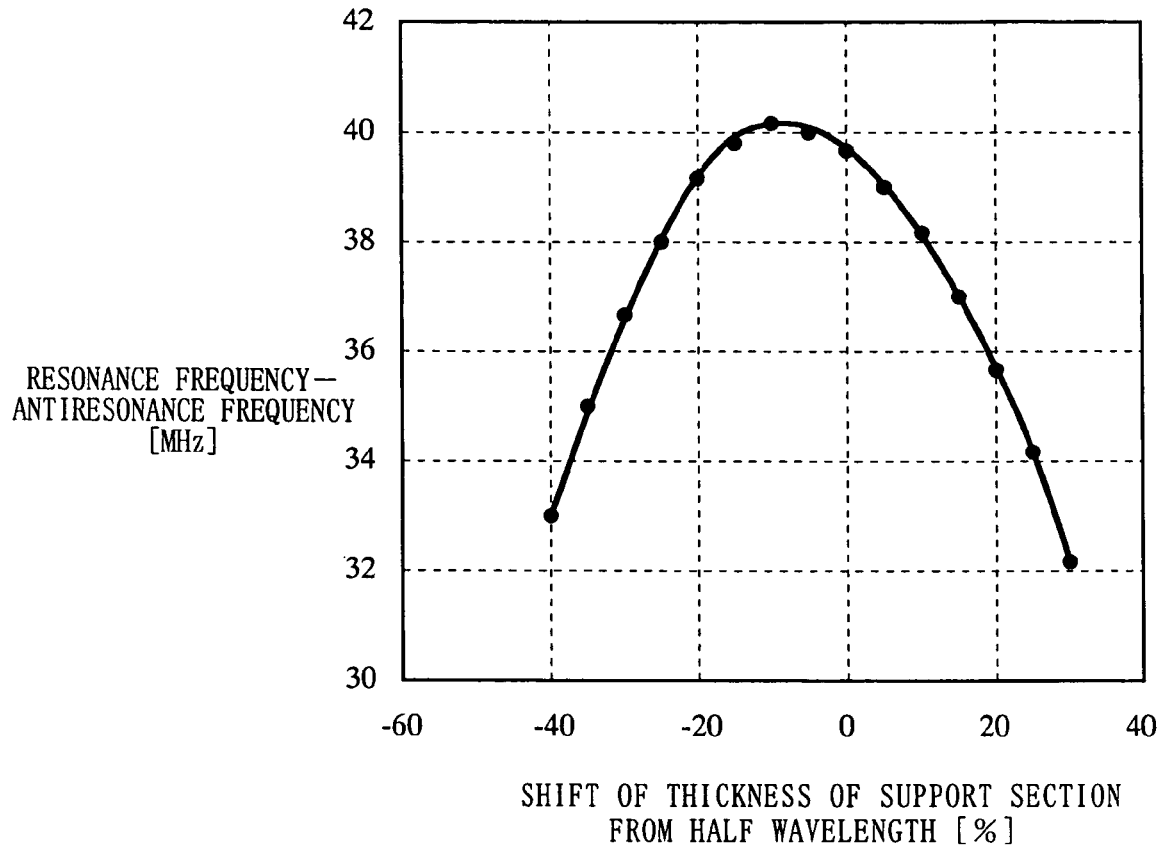
FIG. 4A and FIG. 4B show an exemplary relationship between the thickness of the support section and the wavelength of the resonance frequency in the first acoustic resonator of the present invention.

FIG. 4A and FIG. 4B illustrate a practical design of the acoustic resonator 1. FIG. 4A and FIG. 4B show an exemplary relationship between the thickness of the support section 20 and the wavelength of the resonance frequency in a case where the thickness of the electrode is non-negligible with respect to the piezoelectric element 11 (i.e., electrode/piezoelectric element >0.01). In order to increase the Q-value of the acoustic resonator 1, it is preferred that the difference between the resonance frequency and the antiresonance frequency in the admittance-frequency characteristics is as large as possible. FIG. 4A shows the relationship between the shift of the thickness t2 of the support section 20 from the half wavelength and the difference between the resonance frequency and the antiresonance frequency. FIG. 4B shows whether a filter of an intended frequency band can be realized for each of different amounts of shift of the thickness t2 of the support section 20 from the half wavelength. It can be seen that with the support section 20 in which the proportion of the thickness t2 with respect to the half wavelength is in the range of −30% to +20%, it is possible to obtain characteristics without unnecessary resonance in an intended frequency band, whereby it is possible to realize filter characteristics with a passband loss of 1.5 dB or less. Moreover, if the proportion of the thickness t2 with respect to the half wavelength is in the range of −20% to 5%, a passband loss of 1 dB or less can be realized.

As described above, in the first acoustic resonator 1 of the present invention, the vibrating section 10 and the support section 20, which as a whole vibrates in the one-wavelength mode, are formed with different thicknesses. Moreover, the relationship between the vibrating section 10 and the cavity 31 in terms of the size and position is appropriately adjusted. Thus, the vibrating section 10 and the support section 20 can be designed to have different resonance frequencies, whereby it is possible to reduce the propagation of a vibration in the horizontal direction. Therefore, it is possible to obtain admittance-frequency characteristics without a spurious component between the resonance frequency and the antiresonance frequency of the vibrating section 10.

Figure 5:
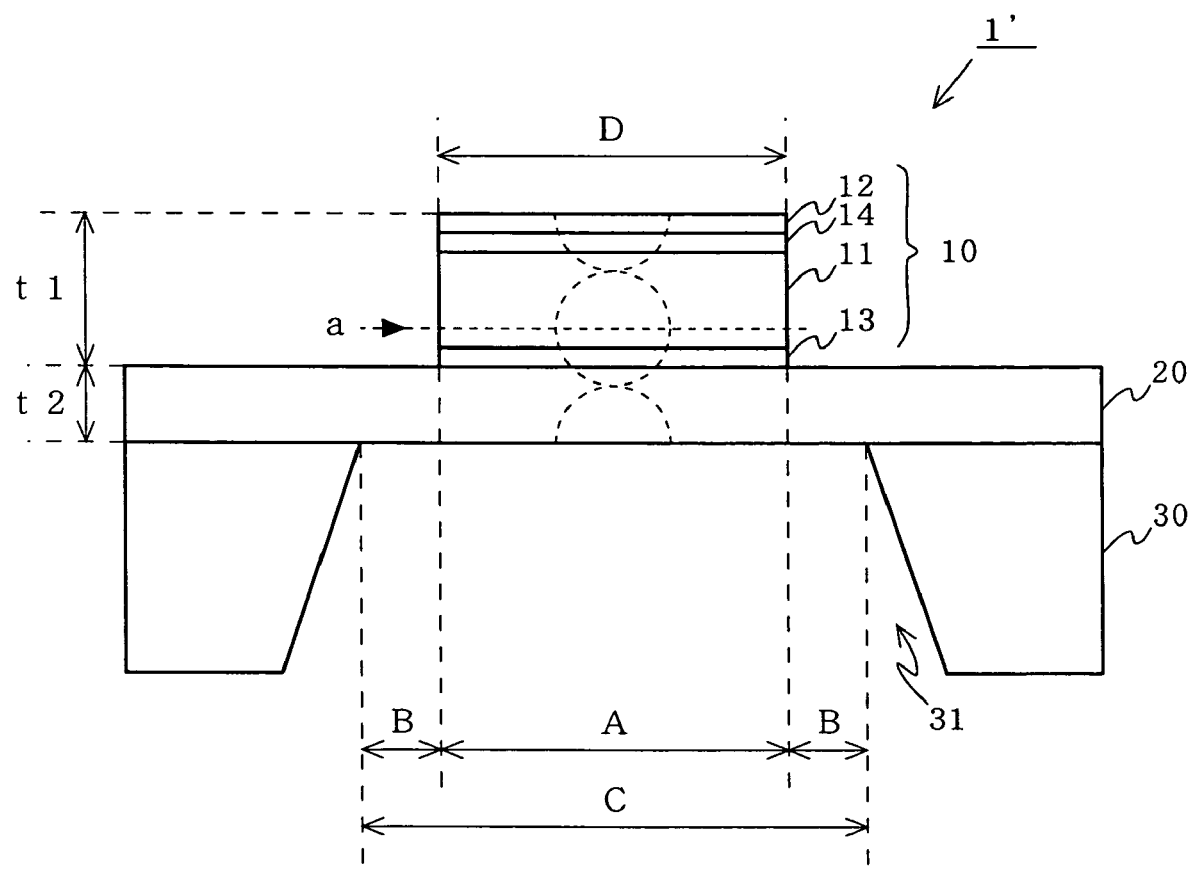
FIG. 5 is a cross-sectional view showing the structure of a variation of the first acoustic resonator of the present invention.

In the first acoustic resonator of the present invention, the vibrating section 10 includes the piezoelectric element 11, the upper electrode 12 and the lower electrode 13. However, the structure is not limited to this, and a dielectric film 14 may be formed, in addition to the piezoelectric element 11, between the upper electrode 12 and the lower electrode 13 (FIG. 5). Similar effects to those described above can be obtained also with such a structure, by designing the acoustic resonator so that the thickness t2 is not equal to the half wavelength of the resonance frequency fr as described above. As long as the thickness t2 is not equal to the half wavelength of the resonance frequency fr, the position where the dielectric film 14 is formed is not limited to between the upper electrode 12 and the piezoelectric element 11 as shown in FIG. 5. For example, the dielectric film 14 may be formed between the lower electrode 13 and the piezoelectric element 11, or both between the upper electrode 12 and the piezoelectric element 11 and between the lower electrode 13 and the piezoelectric element 11.

(Second Acoustic Resonator)

Figure 6A:
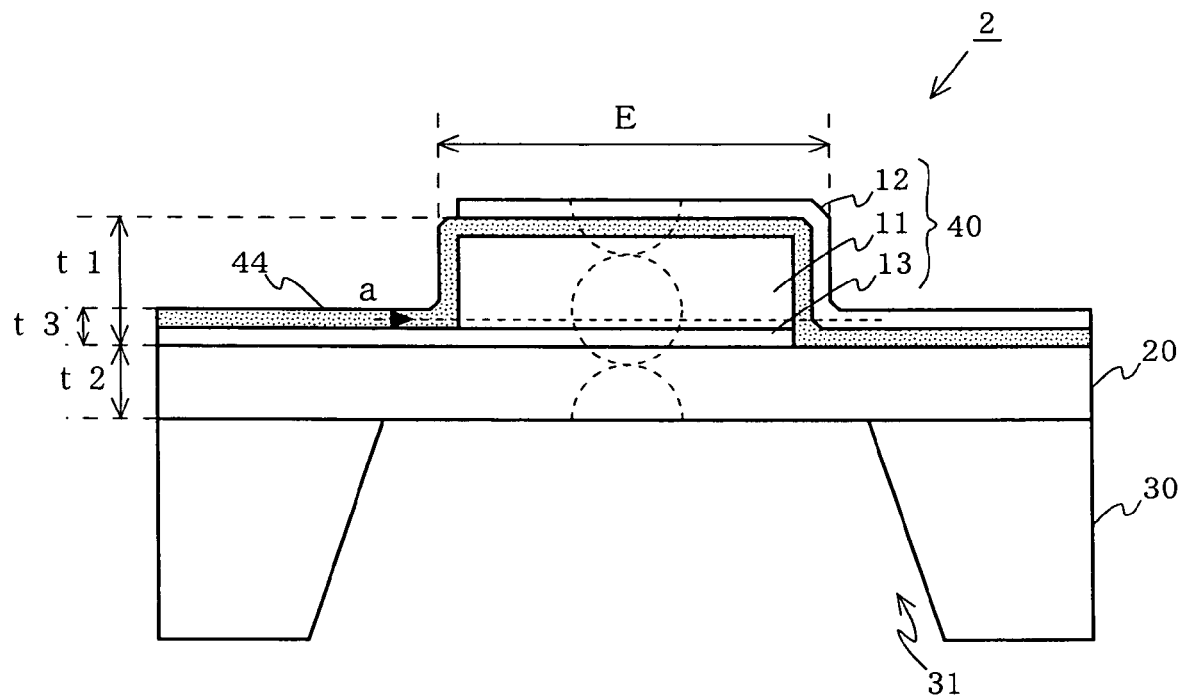
FIG. 6A is a cross-sectional view showing the structure of a second acoustic resonator of the present invention.

FIG. 6A is a cross-sectional view showing the structure of a second acoustic resonator 2 of the present invention. Referring to FIG. 6A, the acoustic resonator 2 includes the substrate 30, the support section 20 formed on the substrate 30, and a vibrating section 40 formed on the support section 20. As shown in FIG. 6A, the acoustic resonator 2 includes the vibrating section 40 instead of the vibrating section 10 of the acoustic resonator 1. The acoustic resonator 2 will now be described while focusing on what is different from the acoustic resonator 1.

The vibrating section 40 includes the piezoelectric element 11 using a piezoelectric material such as aluminum nitride, the upper electrode 12 formed on the upper surface of the piezoelectric element 11, and the lower electrode 13 formed on the lower surface of the piezoelectric element 11. An insulative layer 44 is formed between the piezoelectric element 11 and the upper electrode 12, whereby the interconnect of the upper electrode 12 routed over the substrate 30 and the interconnect of the lower electrode 13 routed over the substrate 30 are completely insulated from each other. The provision of the insulative layer 44 serves to prevent the lower electrode 13 from degrading. The material of the insulative layer 44 is an insulative material such as silicon oxide ($SiO_2$), aluminum nitride or silicon nitride (SiN).

The acoustic resonator 2 as described above is also designed so as to be vibrated in a one-wavelength mode and is designed with a characteristic structure to be described below. The area of the opening C of the cavity 31 is equal to or greater than the area of the horizontal cross section E of the vibrating section 40. The vibrating section 40 is placed on the support section 20 at a position such that the vertical projection of the vibrating section 40 onto the substrate 30 is accommodated within the opening C of the cavity 31. The sum of the vertical thickness t1 of the vibrating section 40 and the vertical thickness t2 of the support section 20 is equal to one wavelength of the resonance frequency fr of the acoustic resonator 2. The thickness t1 of the vibrating section 40 is not equal to the sum of the thickness t2 of the support section 20 and a thickness t3 (t3 is the total thickness of the routed interconnect of the upper electrode 12 and the lower electrode 13 and the insulative layer 44) (t1≠(t2+t3)). In other words, the thicknesses are determined so that the upper surface of the interconnect of the upper electrode 12 routed over the support section 20 via the insulative layer 44 does not coincide with the half wavelength position "a" (antinode of vibration).

Figure 6B:
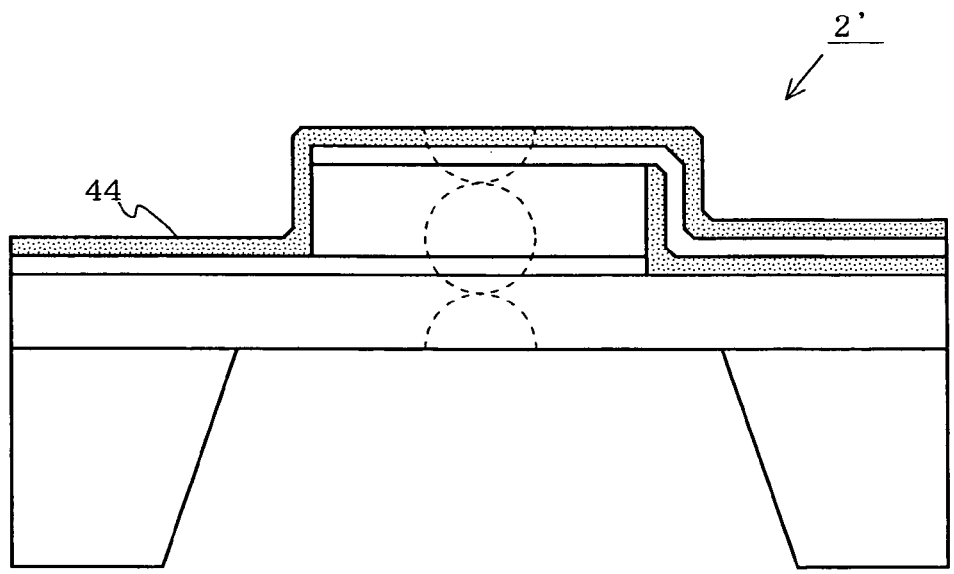
FIG. 6B is a cross-sectional view showing the structure of a variation of the second acoustic resonator of the present invention.

As described above, with the second acoustic resonator 2 of the present invention, in which the insulative layer 44 is formed, the vibrating section 40 and the support section 20 can be designed to have different resonance frequencies, whereby it is possible to reduce the propagation of a vibration in the horizontal direction. Therefore, it is possible to obtain admittance-frequency characteristics without a spurious component between the resonance frequency and the antiresonance frequency of the vibrating section 40. The position at which the layer of the upper electrode 12 is formed is not limited to that shown in FIG. 6A, but may alternatively be that shown in FIG. 6B. In this way, the upper electrode 12 can be prevented from degrading. An additional insulative layer may be provided on the upper electrode 12 shown in FIG. 6A. In such a case, it is necessary to design the acoustic resonator taking into consideration the thickness of the additional insulative layer.

(Third Acoustic Resonator)

Figure 7:
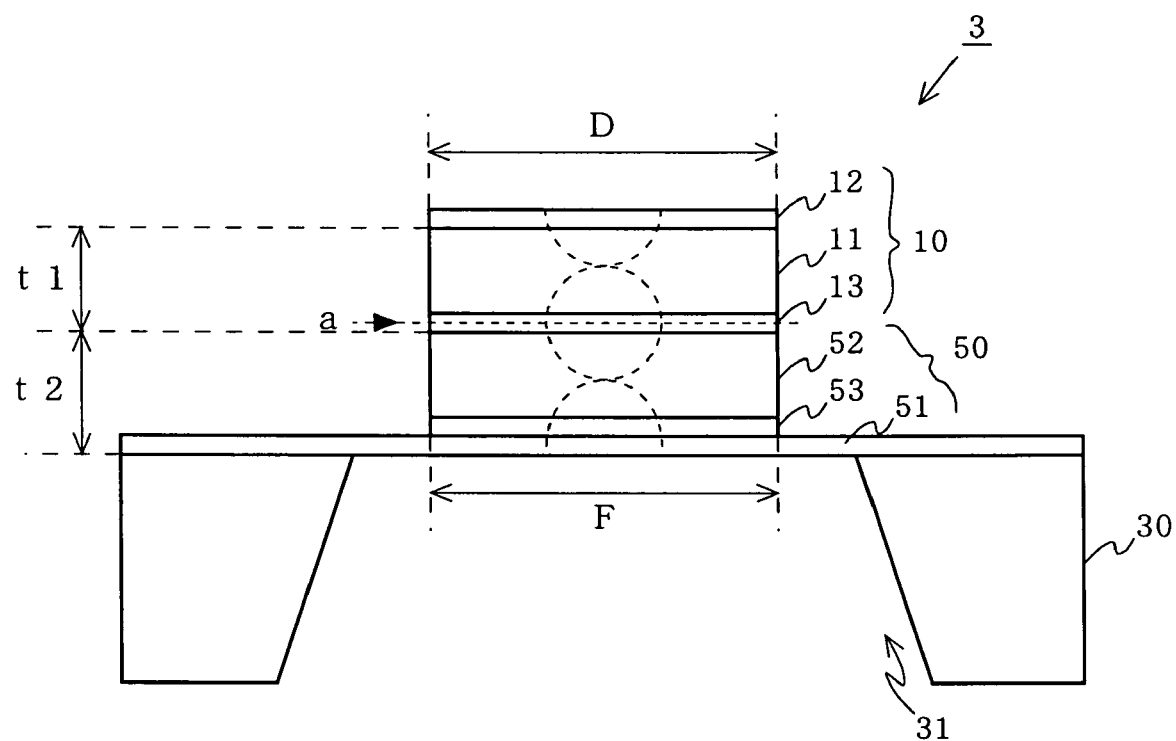
FIG. 7 is a cross-sectional view showing the structure of a third acoustic resonator of the present invention.

FIG. 7 is a cross-sectional view showing the structure of a third acoustic resonator 3 of the present invention. Referring to FIG. 7, the acoustic resonator 3 includes the substrate 30, a support section 50 formed on the substrate 30, and the vibrating section 10 formed on the support section 20. As shown in FIG. 7, the acoustic resonator 3 includes the support section 50 instead of the support section 20 of the acoustic resonator 1. The acoustic resonator 3 will now be described while focusing on what is different from the acoustic resonator 1.

The support section 50 includes a support layer 51, a lower electrode 53 formed on the support layer 51, and a piezoelectric element 52 formed on the lower electrode 53. The piezoelectric element 52 uses a piezoelectric material such as aluminum nitride. This means that a second vibrating section, different from the vibrating section 10, is formed in the support section 50. In such a case, the lower electrode 13 of the vibrating section 10 serves as a middle electrode that also functions as the upper electrode of the second vibrating section. Preferably, the acoustic resonator 3 is designed so that the piezoelectric element 52 and the lower electrode 53 are designed with a horizontal cross section equal to that of the vibrating section 10. Thus, in the acoustic resonator 3, a vibrating section including the piezoelectric element 52 and the lower electrode 53 is provided in the support section 50, whereby it is possible to effectively use the vibration that would otherwise be lost leaking to the support section 50. The material of the lower electrode 53 may be, for example, molybdenum.

The acoustic resonator 3 as described above is also designed so as to be vibrated in a one-wavelength mode and is designed with a characteristic structure to be described below. The area of the opening C of the cavity 31 is equal to or greater than the area of the horizontal cross section D of the vibrating section 10 or the area of a horizontal cross section F of the piezoelectric element 52 or the lower electrode 53. The support section 50 and the vibrating section 10 are placed so that the vertical projection of the piezoelectric element 52 and the lower electrode 53 of the support section 50 onto the substrate 30 and that of the vibrating section 10 are accommodated within the opening C of the cavity 31. The sum of the vertical thickness t1 of the vibrating section 10 and the vertical thickness t2 of the support section 50 is equal to one wavelength of the resonance frequency fr of the acoustic resonator 3. The thickness t1 of the vibrating section 10 and the thickness t2 of the support section 50 are different from each other.

Figure 8A:
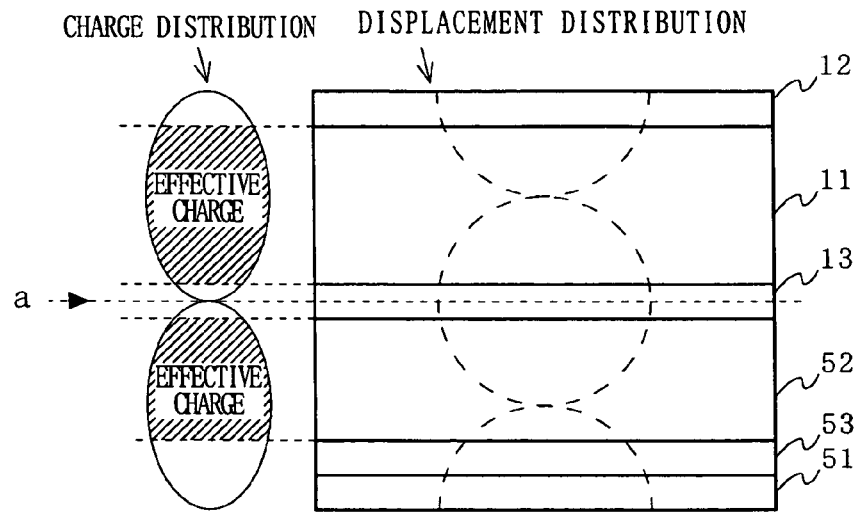
FIG. 8A to FIG. 8C show the displacement distribution and the charge distribution of the third acoustic resonator.
Figure 8B:
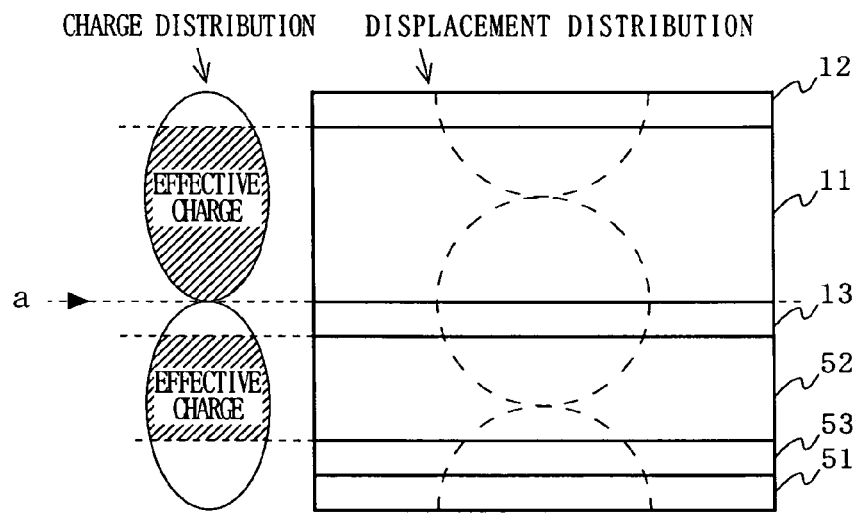
Figure 8C:
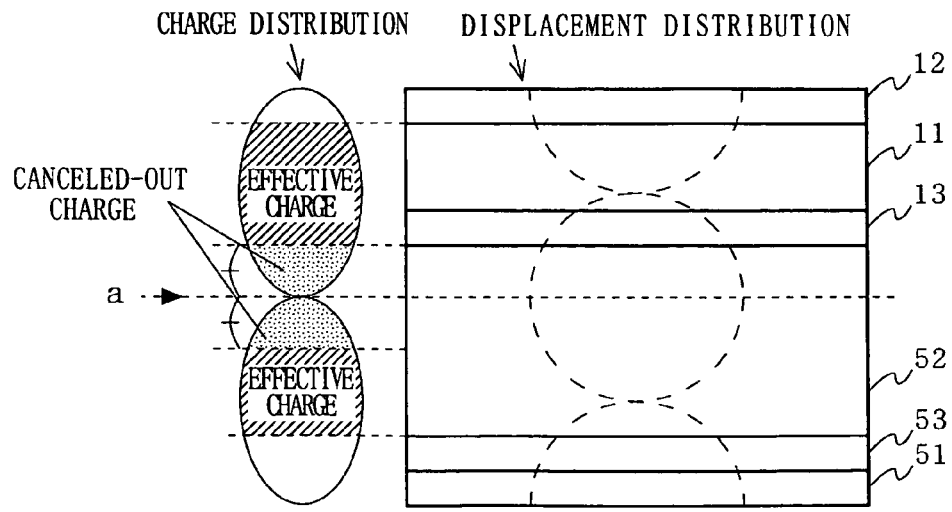

The thickness t1 of the vibrating section 10 and the thickness t2 of the support section 50 can also be optimized as with the acoustic resonator 1 described above. Specifically, the thicknesses are determined so that the interface between the support section 50 and the lower electrode 13 does not coincide with the half wavelength position "a" (antinode of vibration). FIG. 8A to FIG. 8C show the displacement distribution and the charge distribution of the acoustic resonator 3. As can be seen from the figures, since the support section 50 of the acoustic resonator 3 can be vibrated, the amount of charge that can be converted to a vibration is increased, thus reducing the characteristics degradation.

Figures 9A, 9B:
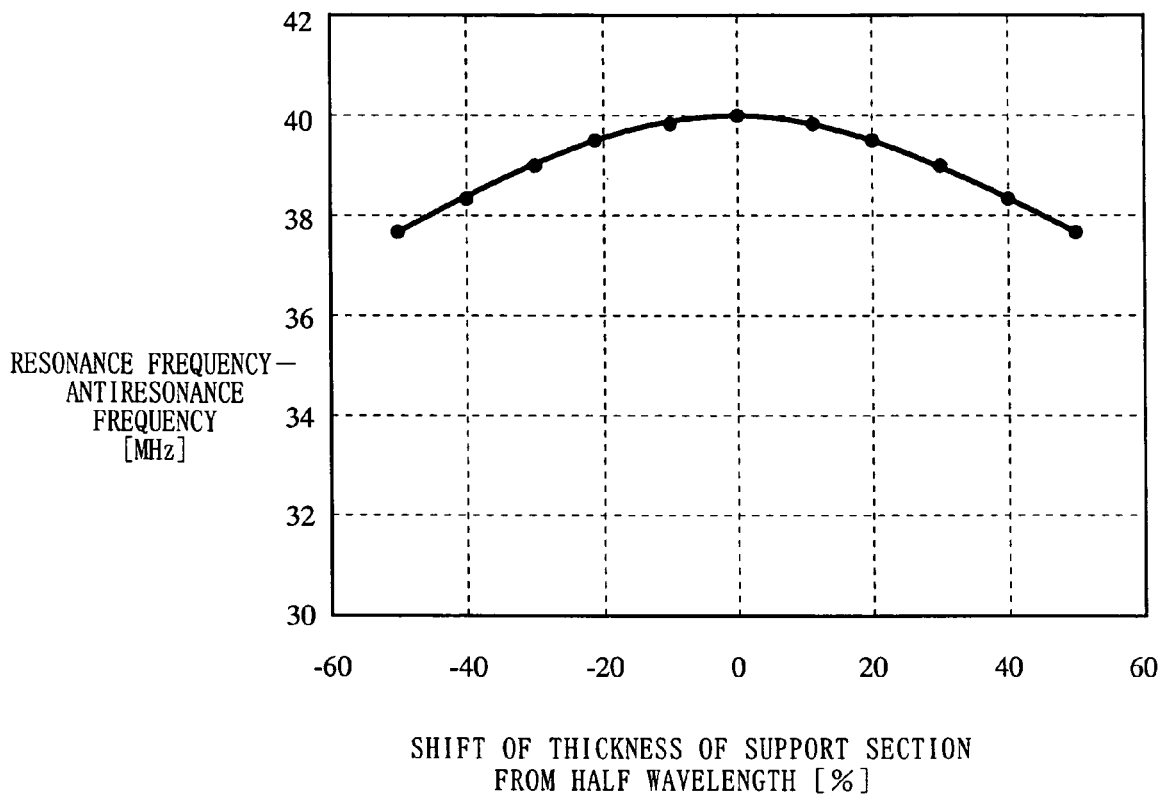
FIG. 9A and FIG. 9B show an exemplary relationship between the thickness of the support section and the wavelength of the resonance frequency in the third acoustic resonator.

FIG. 9A and FIG. 9B illustrate a practical design of the acoustic resonator 3. FIG. 9A shows the relationship between the shift of the thickness t2 of the support section 50 from the half wavelength and the difference between the resonance frequency and the antiresonance frequency. FIG. 9B shows whether a filter of an intended frequency band can be realized for each of different amounts of shift of the thickness t2 of the support section 50 from the half wavelength. It can be seen that with the support section 50 in which the proportion of the thickness t2 with respect to the half wavelength is in the range of −40% to +40%, it is possible to obtain characteristics without unnecessary resonance in an intended frequency band, whereby it is possible to realize filter characteristics with a passband loss of 1.5 dB or less. Moreover, if the proportion of the thickness t2 with respect to the half wavelength is in the range of −30% to 20%, a passband loss of 1 dB or less can be realized.

As described above, with the third acoustic resonator 3 of the present invention, in which a vibrating section is formed in the support section 50, the vibration leaking to the support section 50 can be effectively converted from an electric energy to a mechanical energy, in addition to the effects of the first acoustic resonator described above. As in acoustic resonators 4 and 4' shown in FIG. 10A and FIG. 10B, respectively, the third acoustic resonator of the present invention may be provided with an insulative layer 54, as is the second acoustic resonator described above.

(Fourth Acoustic Resonator)

Figure 11:
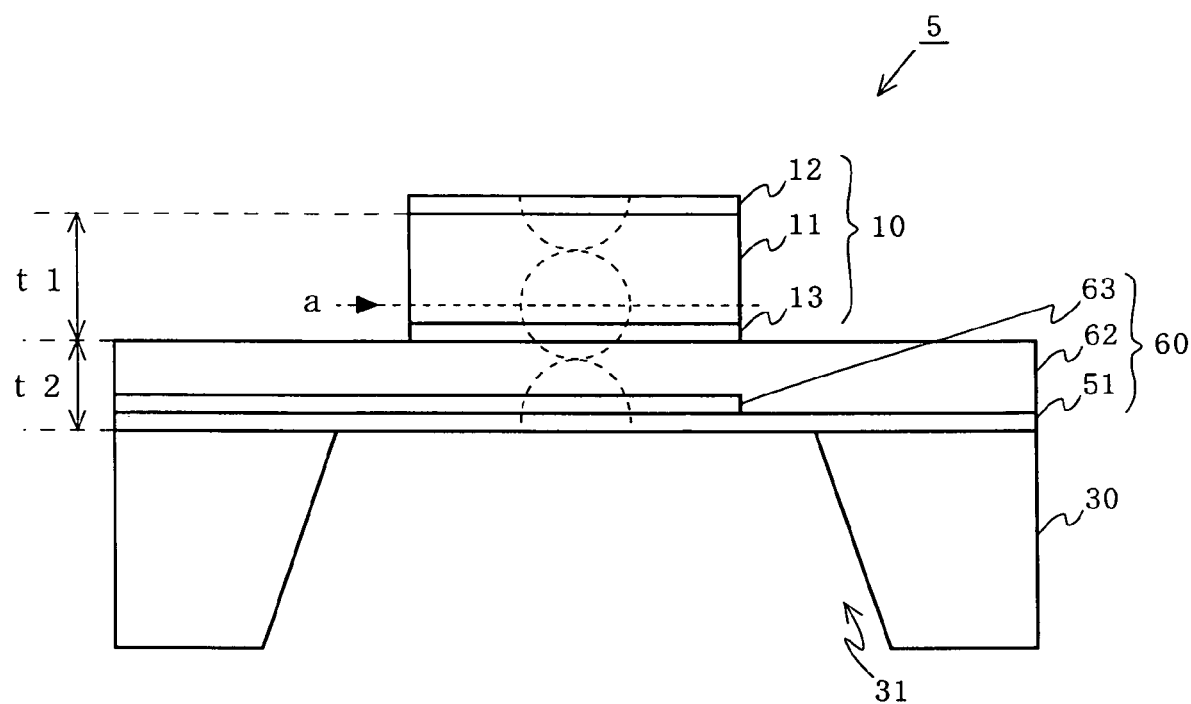
FIG. 11 is a cross-sectional view showing the structure of a fourth acoustic resonator of the present invention.

FIG. 11 is a cross-sectional view showing the structure of a fourth acoustic resonator 5 of the present invention. Referring to FIG. 11, the acoustic resonator 5 includes the substrate 30, a support section 60 formed on the substrate 30, and the vibrating section 10 formed on the support section 60. As shown in FIG. 11, the acoustic resonator 5 includes the support section 60 instead of the support section 50 of the acoustic resonator 3. The acoustic resonator 5 will now be described while focusing on what is different from the acoustic resonator 3.

The support section 60 includes the support layer 51, a lower electrode 63 formed on the support layer 51, and a piezoelectric element 62 formed on the lower electrode 63. The acoustic resonator 5 differs from the acoustic resonator 3 with respect to the length of the piezoelectric element and the lower electrode. The piezoelectric element 62 and the lower electrode 63 of the acoustic resonator 5 are larger than the opening C of the cavity 31.

The acoustic resonator 5 as described above is also designed so as to be vibrated in a one-wavelength mode and is designed with a characteristic structure to be described below. The area of the opening C of the cavity 31 is equal to or greater than the area of the horizontal cross section D of the vibrating section 10. The vibrating section 10 is placed on the support section 20 at a position such that the vertical projection of the vibrating section 10 onto the substrate 30 is accommodated within the opening C of the cavity 31. The sum of the vertical thickness t1 of the vibrating section 10 and the vertical thickness t2 of the support section 60 is equal to one wavelength of the resonance frequency fr of the acoustic resonator 5. The thickness t1 of the vibrating section 10 and the thickness t2 of the support section 60 are different from each other. Specifically, the thicknesses are determined so that the interface between the support section 60 and the lower electrode 13 does not coincide with the half wavelength position "a" (antinode of vibration).

Figure 10A:
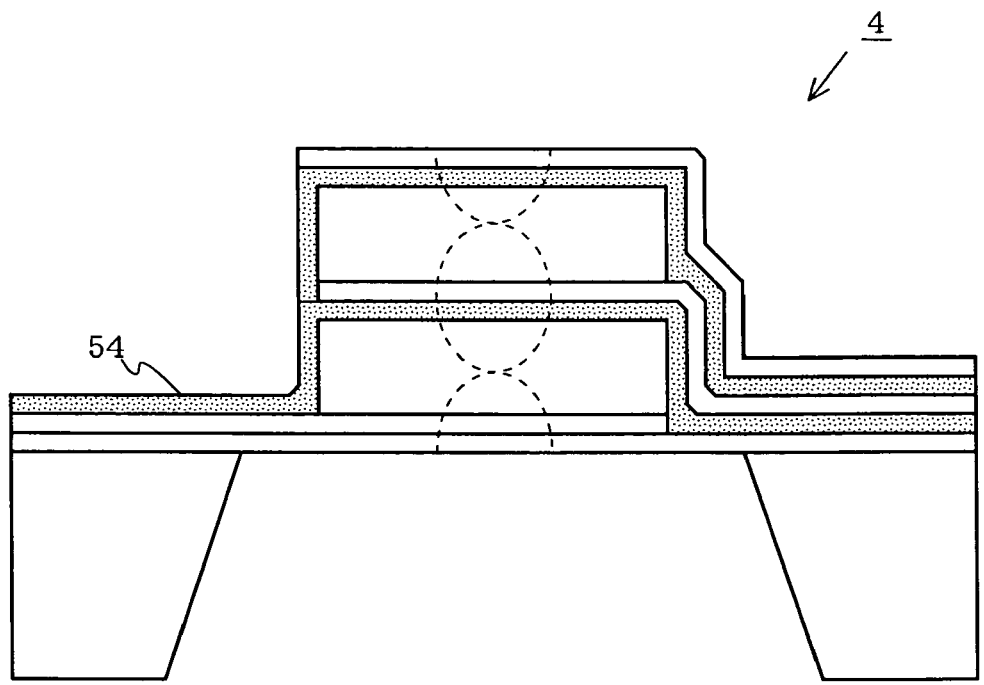
FIG. 10A and FIG. 10B are cross-sectional views each showing the structure of a variation of the third acoustic resonator of the present invention.
Figure 10B:
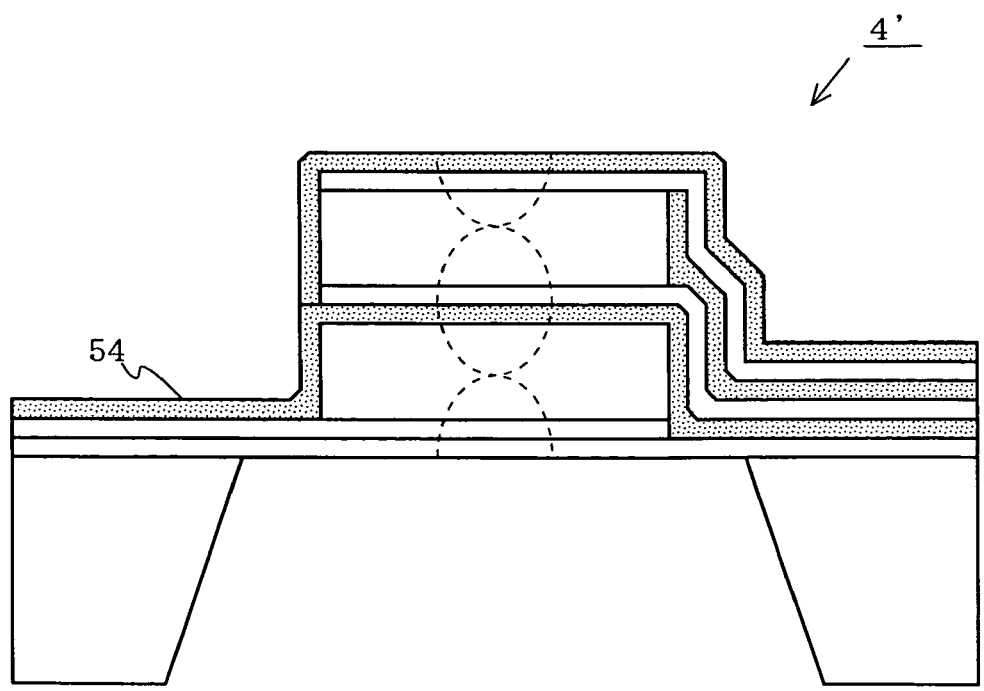

As described above, with the fourth acoustic resonator 5 of the present invention, in which the vibrating section 10 is supported also by the piezoelectric element 62 and the lower electrode 63 formed in the support section 60, the strength reliability of the support section 60 is improved, in addition to the effects of the third acoustic resonator described above. Also in the acoustic resonator 5, an insulative layer may be formed as shown in FIG. 10A and FIG. 10B. If a sufficient strength is ensured by the piezoelectric element 62 and the lower electrode 63, the support layer 51 may be omitted.

Any of the first to fourth acoustic resonators described above or a plurality of any of the first to fourth acoustic resonators described above may be used to form a filter. Filters using a plurality of acoustic resonators of the present invention, and apparatuses using such filters will now be described.

(First Filter Using Acoustic Resonator)

Figure 12A:
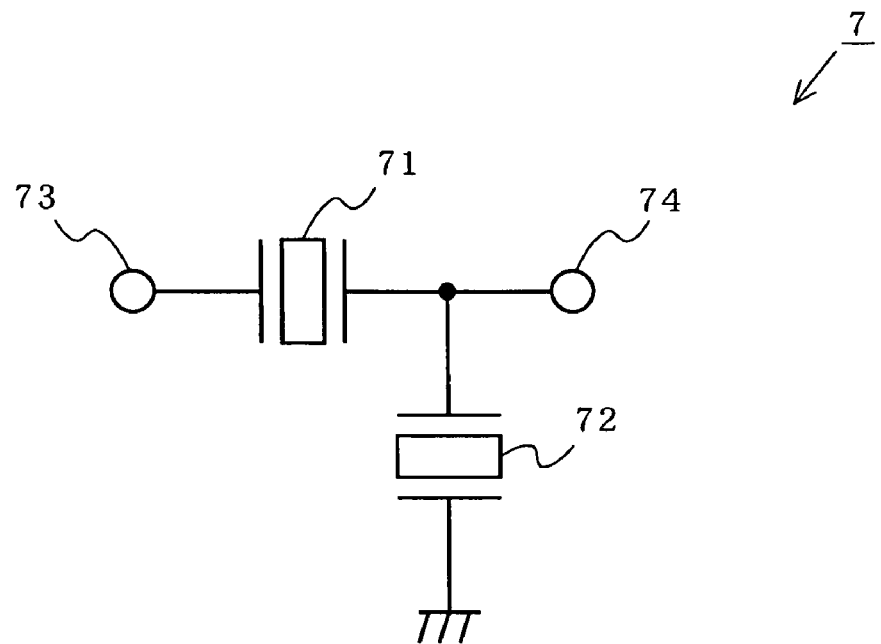
FIG. 12A and FIG. 12B each show a first filter of the present invention using an acoustic resonator of the present invention.
Figure 12B:
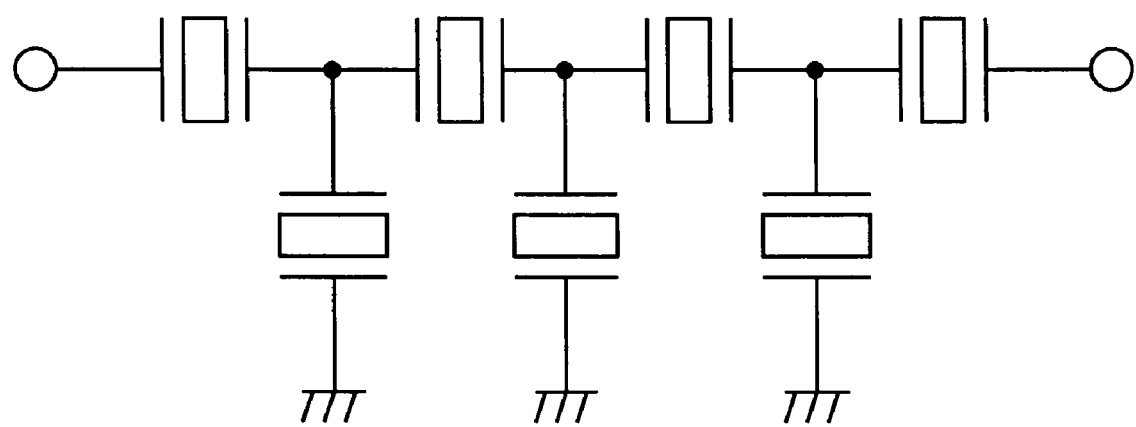

FIG. 12A and FIG. 12B each show a first filter 7 of the present invention using acoustic resonators of the present invention. Referring to FIG. 12A, the filter 7 is a single-stage ladder filter using a first and/or second acoustic resonator of the present invention connected together in an L-type connection. A first acoustic resonator 71 is connected so as to operate as a series resonator. Specifically, the first acoustic resonator 71 is connected in series between an input terminal 73 and an output terminal 74. A second acoustic resonator 72 is connected so as to operate as a parallel resonator. Specifically, the second acoustic resonator 72 is connected between the path from the input terminal 73 to the output terminal 74 and the ground plane. If the resonance frequency of the first acoustic resonator 71 is set to be higher than that of the second acoustic resonator 72, it is possible to realize a ladder filter having bandpass characteristics. Preferably, the resonance frequency of the first acoustic resonator 71 and the antiresonance frequency of the second acoustic resonator 72 are substantially equal or close to each other, in which case it is possible to realize a ladder filter having desirable passband flatness.

While the first filter of the present invention is a ladder filter of an L-type arrangement, similar effects can be obtained with other types of arrangements, including T-type, π-type and lattice-type arrangements. Moreover, a ladder filter of the present invention may be a single-stage ladder filter as shown in FIG. 12A or a multi-stage ladder filter as shown in FIG. 12B.

(Second Filter Using Acoustic Resonator)

Figure 13:
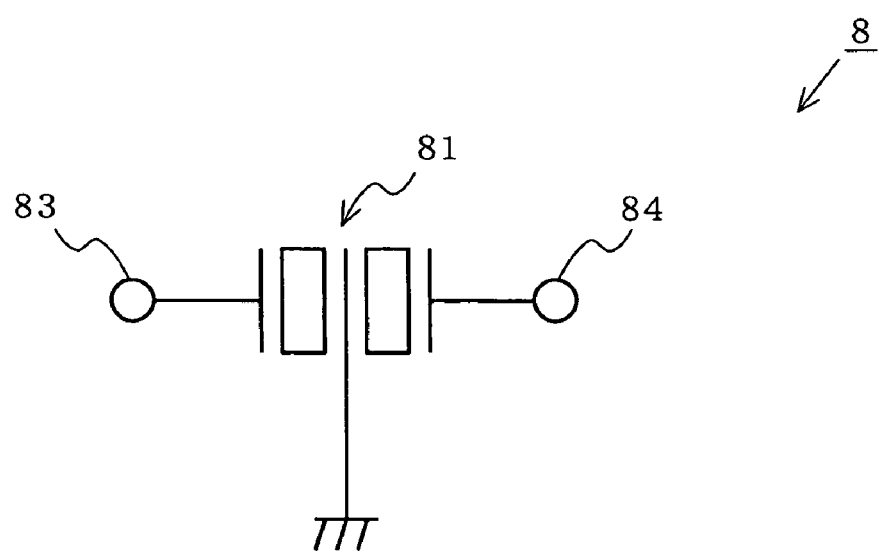
FIG. 13 shows a second filter of the present invention using an acoustic resonator of the present invention.

FIG. 13 shows a second filter 8 of the present invention using an acoustic resonator of the present invention. Referring to FIG. 13, the filter 8 is a stacked filter using a third and/or fourth acoustic resonator of the present invention. An acoustic resonator 81 is connected in series between an input terminal 83 and an output terminal 84. The middle electrode of the acoustic resonator 81 is connected to the ground plane. Thus, by using the acoustic resonator 81 with no spurious component, it is possible to realize a stacked filter having desirable passband flatness.

A stacked filter of the present invention may be a single-stage stacked filter as shown in FIG. 13 or a multi-stage stacked filter. Moreover, similar effects can be obtained by using a first and/or second acoustic resonator of the present invention.

(First Apparatus Using Acoustic Resonator)

Figure 14:
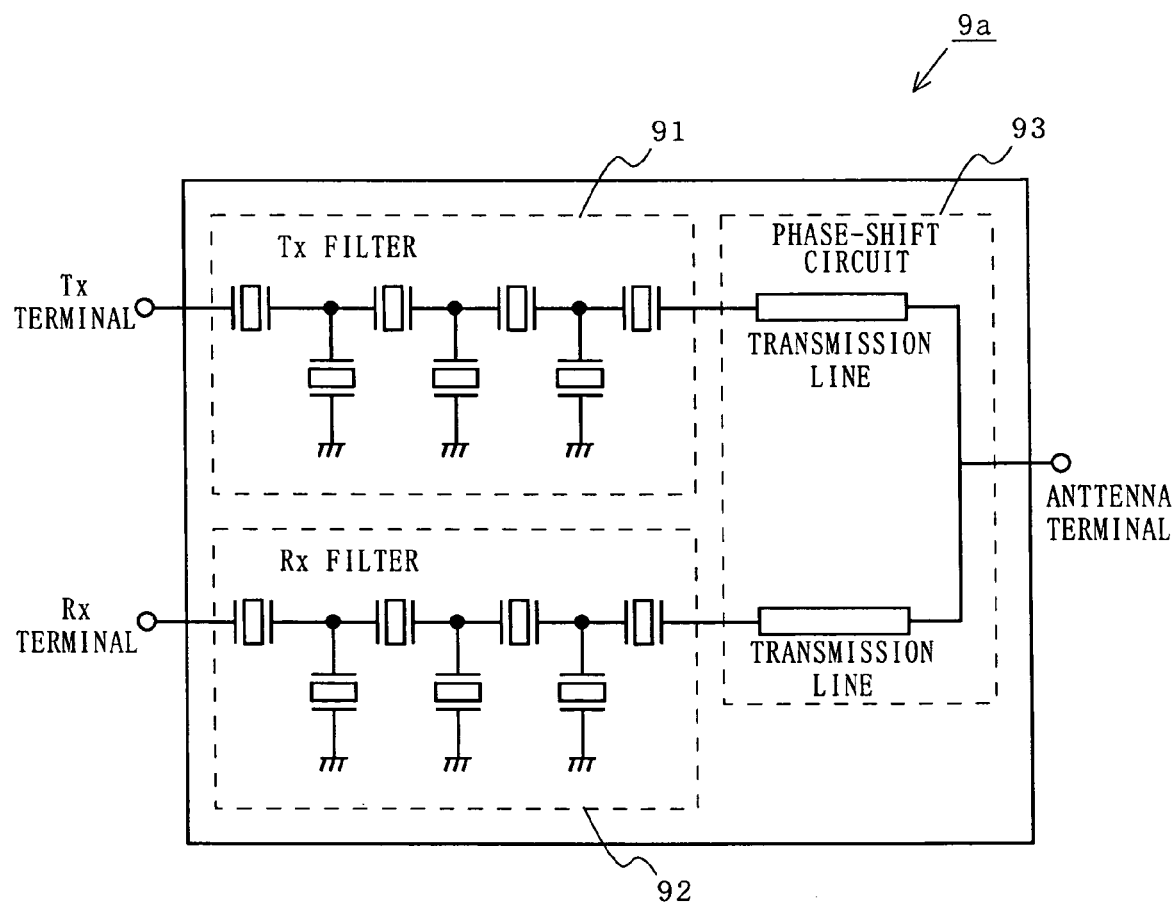
FIG. 14 shows a first apparatus of the present invention using an acoustic resonator of the present invention.

FIG. 14 shows a first apparatus 9a using acoustic resonators of the present invention. The apparatus 9a shown in FIG. 14 is a duplexer using filters as shown in FIG. 12B. The apparatus 9a includes a Tx filter (transmission filter) 91 including a plurality of acoustic resonators, an Rx filter (reception filter) 92 including a plurality of acoustic resonators, and a phase-shift circuit 93 including two transmission lines. Since each of the Tx filter 91 and the Rx filter 92 is a filter having an optimal frequency allocation, it is possible to obtain a duplexer having desirable characteristics such as reduced loss. The number of filters and the number of stages of acoustic resonators in each filter are not limited to those shown in FIG. 14, but may be any other suitable number.

Second Apparatus Using Acoustic Resonator)

Figure 15:
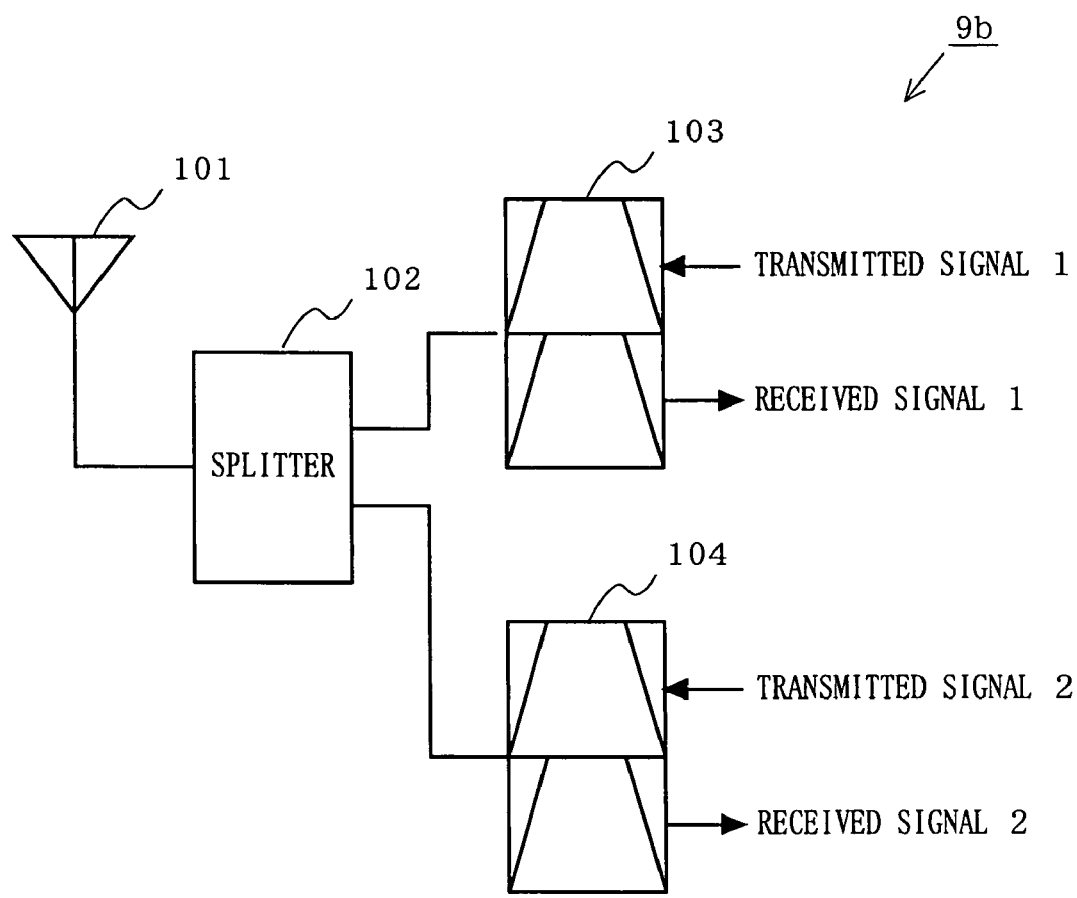
FIG. 15 shows a second apparatus of the present invention using an acoustic resonator of the present invention.

FIG. 15 shows a second apparatus 9b using acoustic resonators of the present invention. The apparatus 9b shown in FIG. 15 is a communications device using a duplexer as shown in FIG. 14. The apparatus 9b includes an antenna 101, a splitter 102 for separating two frequency signals from each other, and two duplexers 103 and 104. Either the duplexer 103 or the duplexer 104 is the duplexer shown in FIG. 14. Thus, by using a duplexer having desirable characteristics such as reduced loss, it is possible to realize a communications device with reduced loss.

(Third Apparatus Using Acoustic Resonator)

Figure 16:
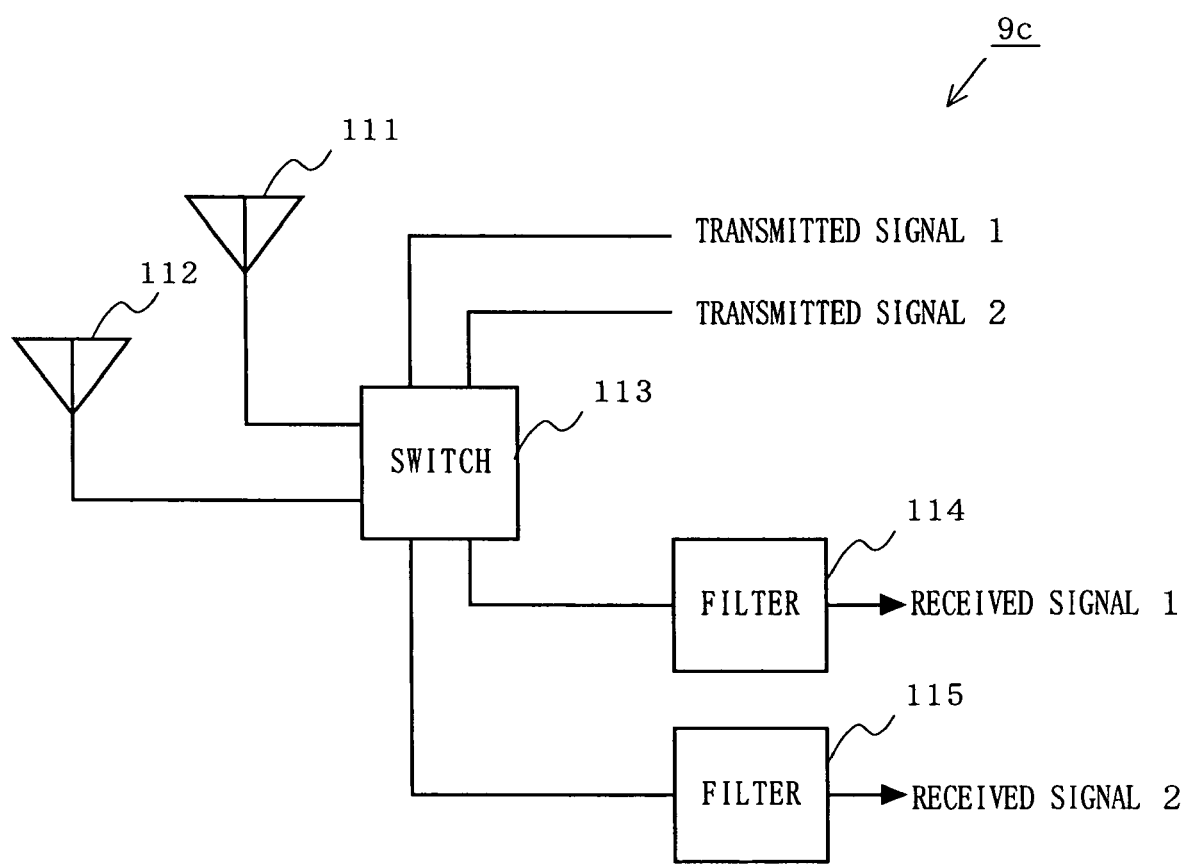
FIG. 16 shows a third apparatus of the present invention using an acoustic resonator of the present invention.

FIG. 16 shows a third apparatus 9c using acoustic resonators of the present invention. The apparatus 9c shown in FIG. 16 is a communications device using filters as shown in FIG. 12A, FIG. 12B or FIG. 13. The apparatus 9c includes two antennas 111 and 112, a switch 113 for switching between two frequency signals, and two filters 114 and 115. The communications device of FIG. 16 differs from the communications device of FIG. 15 in that the switch 113 is used instead of the splitter 102, and the filters 114 and 115 are used instead of the duplexers 103 and 104. Also with such a configuration, it is possible to realize a communications device with reduced loss.

While the invention has been described in detail, the foregoing description is in all aspects illustrative and not restrictive. It is understood that numerous other modifications and variations can be devised without departing from the scope of the invention.

What is claimed is:

1. An acoustic resonator for vibrating at a predetermined frequency, comprising:

a vibrating section including a piezoelectric element, an upper electrode formed on an upper surface of the piezoelectric element, and a lower electrode formed on a lower surface of the piezoelectric element;

a substrate section with a cavity formed therein, the cavity having an opening with an area equal to or greater than a horizontal cross section of the vibrating section; and a support section formed between the vibrating section and the substrate section, wherein:

the vibrating section is located on the support section at a position such that a vertical projection of the vibrating section onto the substrate section is accommodated within the opening of the cavity; and the vibrating section and the support section are shaped so that vertical thicknesses thereof are different from each other with a sum of the vertical thicknesses being equal to one wavelength of a resonant vibration frequency of the acoustic resonator, and are shaped so that an interface between the piezoelectric element and the lower electrode does not coincide with an antinode of the resonant vibration frequency of the acoustic resonator.

2. The acoustic resonator according to claim 1, wherein a proportion of the thickness of the support section with respect to a half wavelength of the resonant vibration frequency is in a range of −30% to +20%.

3. The acoustic resonator according to claim 1, wherein the upper electrode of the vibrating section is extended over an upper surface of the piezoelectric element via an insulative layer, and thicknesses of the vibrating section and the support section are determined so that neither an upper surface of the insulative layer formed on the support section nor an upper surface of an interconnect of the upper electrode routed over the support section via the insulative layer coincides with the antinode of the resonant vibration frequency of the acoustic resonator.

4. An acoustic resonator for vibrating at a predetermined frequency, comprising:

a vibrating section including a first piezoelectric element, an upper electrode formed on an upper surface of the first piezoelectric element, and a first lower electrode formed on a lower surface of the first piezoelectric element;

a substrate section with a cavity formed therein, the cavity having an opening with an area equal to or greater than a horizontal cross section of the vibrating section; and a support section formed between the vibrating section and the substrate section, the support section including a second piezoelectric element, a second lower electrode formed on a lower surface of the second piezoelectric element, and a support layer formed on a lower surface of the second lower electrode, wherein:

the vibrating section is located on the support section at a position such that a vertical projection of the vibrating section onto the substrate section is accommodated within the opening of the cavity; and the vibrating section and the support section are shaped so that vertical thicknesses thereof are different from each other with a sum of the vertical thicknesses being equal to one wavelength of a vibration frequency, and are shaped so that an interface between the first piezoelectric element and the first lower electrode does not coincide with an antinode of vibration.

5. The acoustic resonator according to claim 4, wherein a proportion of the thickness of the support section with respect to a half wavelength of the vibration frequency is in a range of −40% to +40%.

6. The acoustic resonator according to claim 4, wherein the second piezoelectric element and the second lower electrode are shaped so that a horizontal cross section thereof is less than or equal to the area of the opening of the cavity and so that a vertical projection thereof onto the substrate section is accommodated within the opening of the cavity.

7. The acoustic resonator according to claim 4, wherein the upper electrode of the vibrating section is extended over an upper surface of the first piezoelectric element via an insulative layer, and thicknesses of the vibrating section and the support section are determined so that neither an upper surface of the insulative layer formed on the support section nor an upper surface of an interconnect of the upper electrode routed over the support section via the insulative layer coincides with the antinode of vibration.

8. A filter, comprising two or more acoustic resonators according to claim 1 connected together in a ladder form.

9. A duplexer, comprising:

a transmission filter;

a reception filter; and a phase-shift circuit connecting the transmission filter and the reception filter with each other;

wherein each of said transmission filter and the reception filter includes two or more acoustic resonators according to claim 1 connected together in a ladder form.

10. A communications device, comprising:

a first duplexer;

a second duplexer; and a splitter for splitting a signal between the first duplexer and the second duplexer;

wherein each of the first duplexer and the second duplexer constitutes a duplexer according to claim 9.

11. A communications device, comprising:

a first filter;

a second filter; and a switch for passing an input signal selectively to the first filter or the second filter;

wherein each of the first filter and the second filter includes two or more acoustic resonators according to claim 1.

12. A filter, comprising two or more acoustic resonators according to claim 4 connected together in a ladder form.

13. A duplexer, comprising:

a transmission filter;

a reception filter; and a phase-shift circuit connecting the transmission filter and the reception filter with each other;

wherein each of the transmission filter and the reception filter includes two or more acoustic resonators according to claim 4 connected together in a ladder form.

14. A communications device, comprising:

a first duplexer;

a second duplexer; and a splitter for splitting a signal between the first duplexer and the second duplexer;

wherein each of the first duplexer and the second duplexer constitutes a duplexer according to claim 13.

15. A communications device, comprising:

a first filter;

a second filter; and a switch for passing an input signal selectively to the first filter or the second filter;

wherein each of the first filter and the second filter includes two or more acoustic resonators according to claim 4.

* * * * *